US012787729B2

(12) United States Patent
Huang et al.

(10) Patent No.: US 12,787,729 B2
(45) Date of Patent: Nov. 3, 2026

(54) METHOD OF FORMING PATTERNS, PACKAGE, AND MANUFACTURING METHOD OF PACKAGE

(71) Applicant: Taiwan Semiconductor Manufacturing Company, Ltd., Hsinchu (TW)

(72) Inventors: Yi-Chun Huang, Miaoli County (TW); Li-Hsuan Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 365 days.

(21) Appl. No.: 18/396,675

(22) Filed: Dec. 26, 2023

(65) Prior Publication Data

US 2025/0210564 A1 Jun. 26, 2025

(51) Int. Cl.

| | |
|---|---|
| ***H10W 20/00*** | (2026.01) |
| *H10W 70/09* | (2026.01) |
| *H10W 70/60* | (2026.01) |
| *H10W 70/685* | (2026.01) |
| *H10W 72/90* | (2026.01) |
| *H10W 90/00* | (2026.01) |
| *H10W 90/15* | (2026.01) |

(52) U.S. Cl.

CPC ....... *H10W 20/036* (2026.01); *H10W 20/084* (2026.01); *H10W 70/09* (2026.01); *H10W 70/60* (2026.01); *H10W 70/685* (2026.01); *H10W 72/952* (2026.01); *H10W 90/155* (2026.01); *H10W 90/792* (2026.01)

(58) Field of Classification Search

CPC . H10W 20/036; H10W 20/035; H10W 70/09; H10W 20/084

See application file for complete search history.

(56) References Cited

U.S. PATENT DOCUMENTS

| | | | | |
|---|---|---|---|---|
| 6,136,682 A * | 10/2000 | Hegde | H10W 20/084 438/622 |
| 6,537,913 B2 * | 3/2003 | Modak | H10W 20/035 438/687 |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |

(Continued)

FOREIGN PATENT DOCUMENTS

TW 202308153 2/2023

OTHER PUBLICATIONS

"Office Action of Taiwan Counterpart Application", issued on Sep. 12, 2024, p. 1-p. 4.

*Primary Examiner* — Peter M Albrecht
(74) *Attorney, Agent, or Firm* — JCIPRNET

(57) ABSTRACT

A method of forming patterns includes at least the following steps. A first dielectric layer having a first opening is provided. A first seed layer and a first conductive layer are deposited in the first opening. A portion of the first conductive layer is removed to form a recess. A vacancy migration blocking layer and a second conductive layer are deposited in the recess such that the first seed layer, the first conductive layer, the vacancy migration blocking layer, and the second conductive layer form a first pattern.

20 Claims, 33 Drawing Sheets

(56) References Cited

U.S. PATENT DOCUMENTS

| | | | | |
|---|---|---|---|---|
| 9,263,511 | B2 | 2/2016 | Yu et al. | |
| 9,281,254 | B2 | 3/2016 | Yu et al. | |
| 9,299,649 | B2 | 3/2016 | Chiu et al. | |
| 9,368,460 | B2 | 6/2016 | Yu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2009/0096098 | A1* | 4/2009 | Yang | H10W 70/09 257/738 |
| 2017/0125376 | A1* | 5/2017 | Yeh | H10W 70/614 |
| 2022/0293764 | A1 | 9/2022 | Yamazaki et al. | |
| 2022/0415817 | A1* | 12/2022 | Lin | H10W 20/035 |

* cited by examiner

METHOD OF FORMING PATTERNS, PACKAGE, AND MANUFACTURING METHOD OF PACKAGE

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. For example, pattern forming technologies play significant roles in the wafer level packaging. How to ensure the quality of the patterns and the process simplicity has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
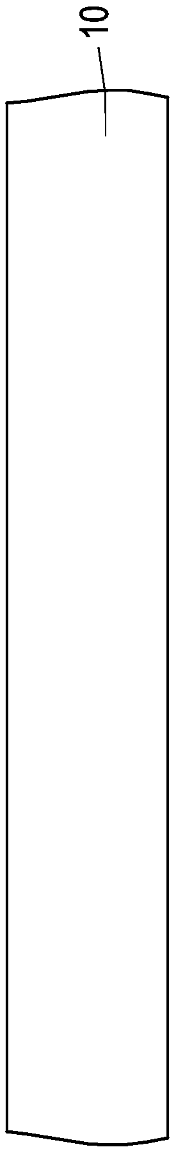
FIG. 1A to FIG. 1N are schematic cross-sectional views illustrating a method of forming patterns in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
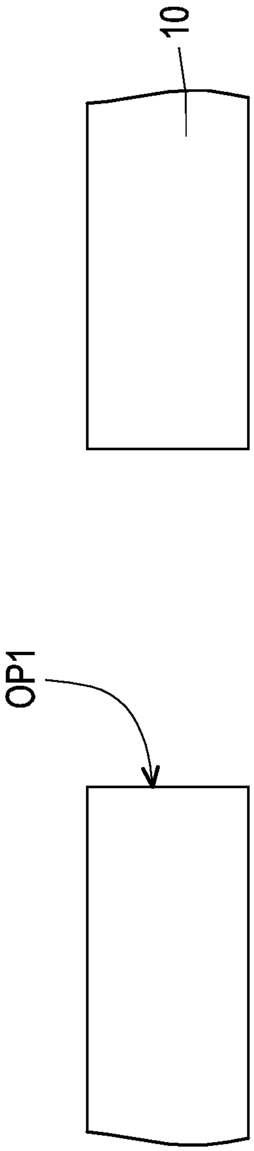
Figure 1C:
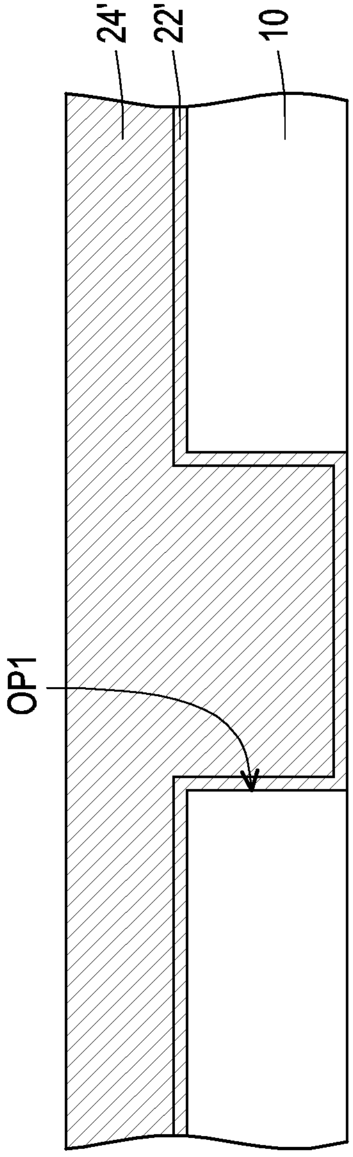
Figure 1D:
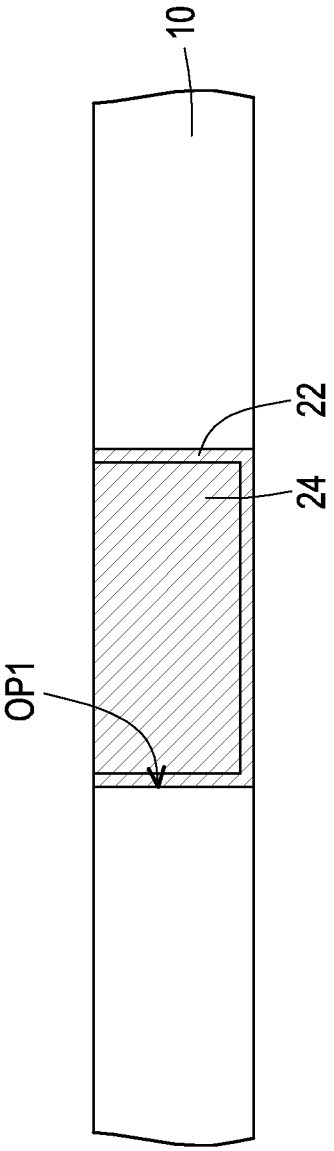
Figure 1E:
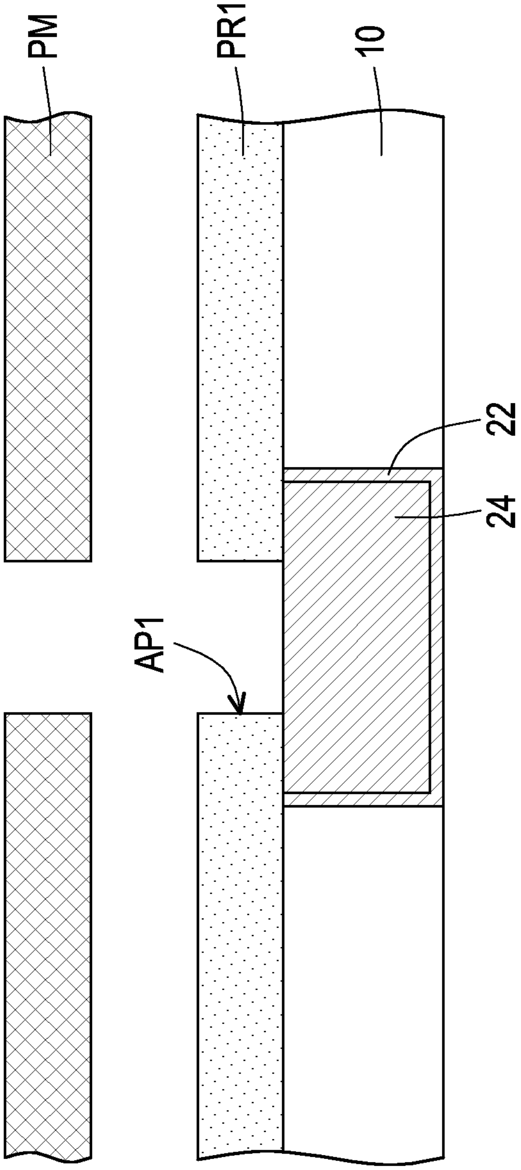
Figure 1F:
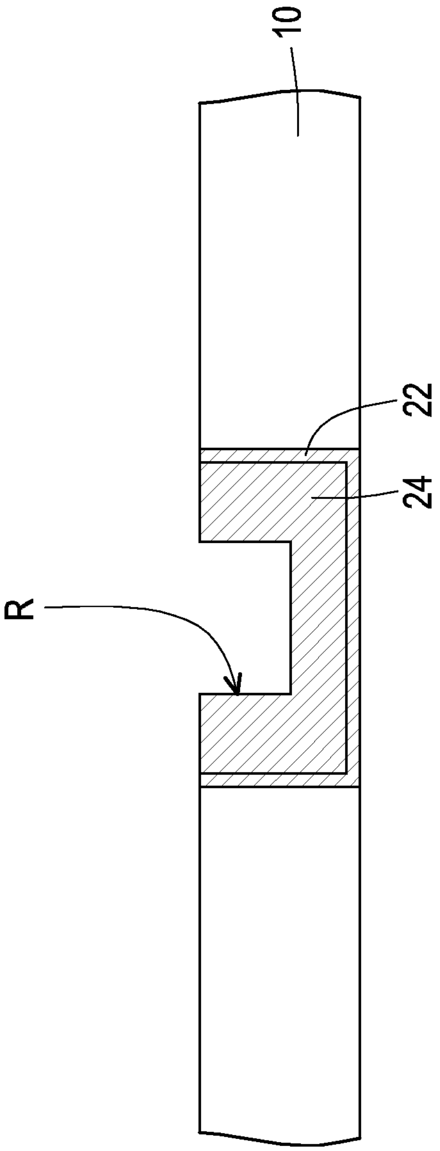
Figure 1G:
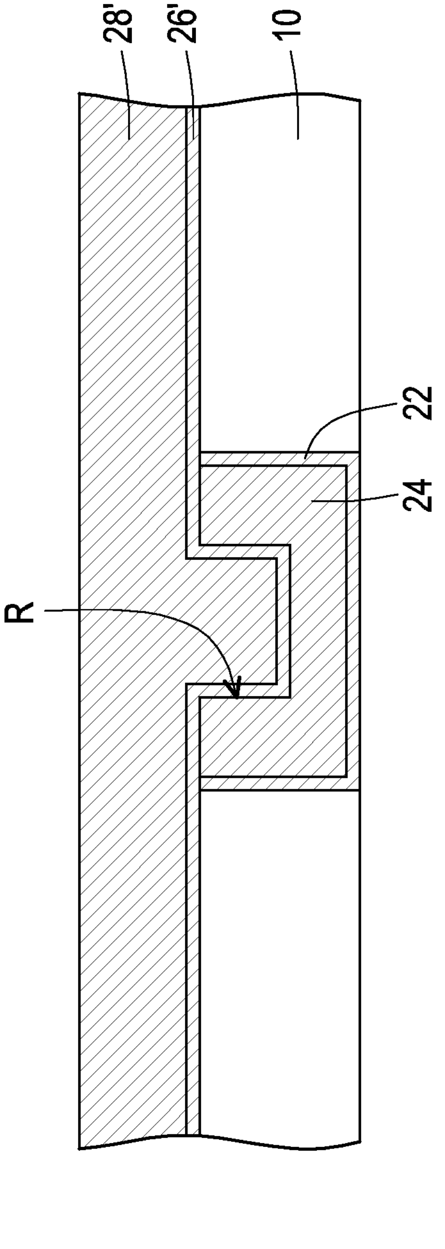
Figure 1H:
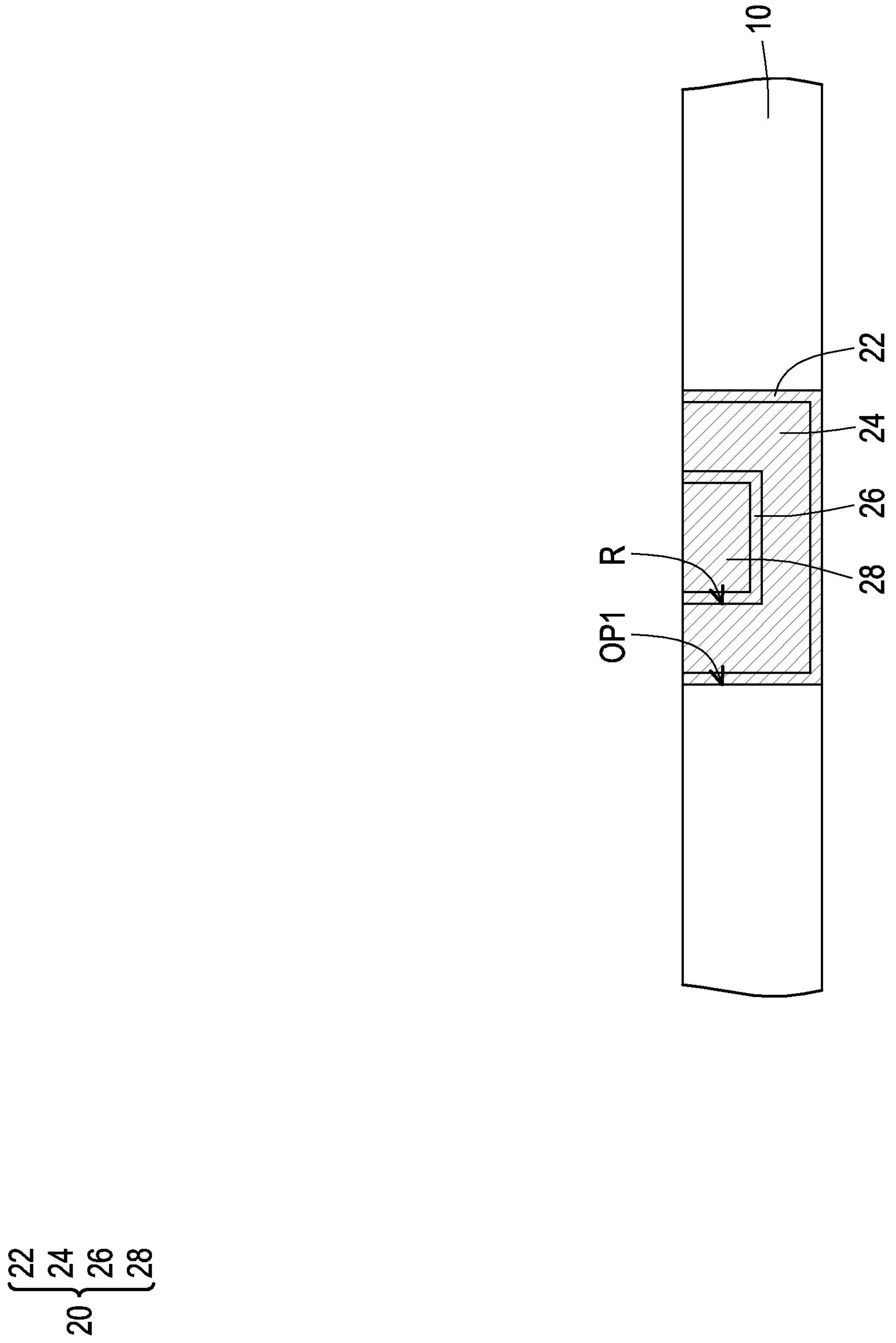
Figure 1I:
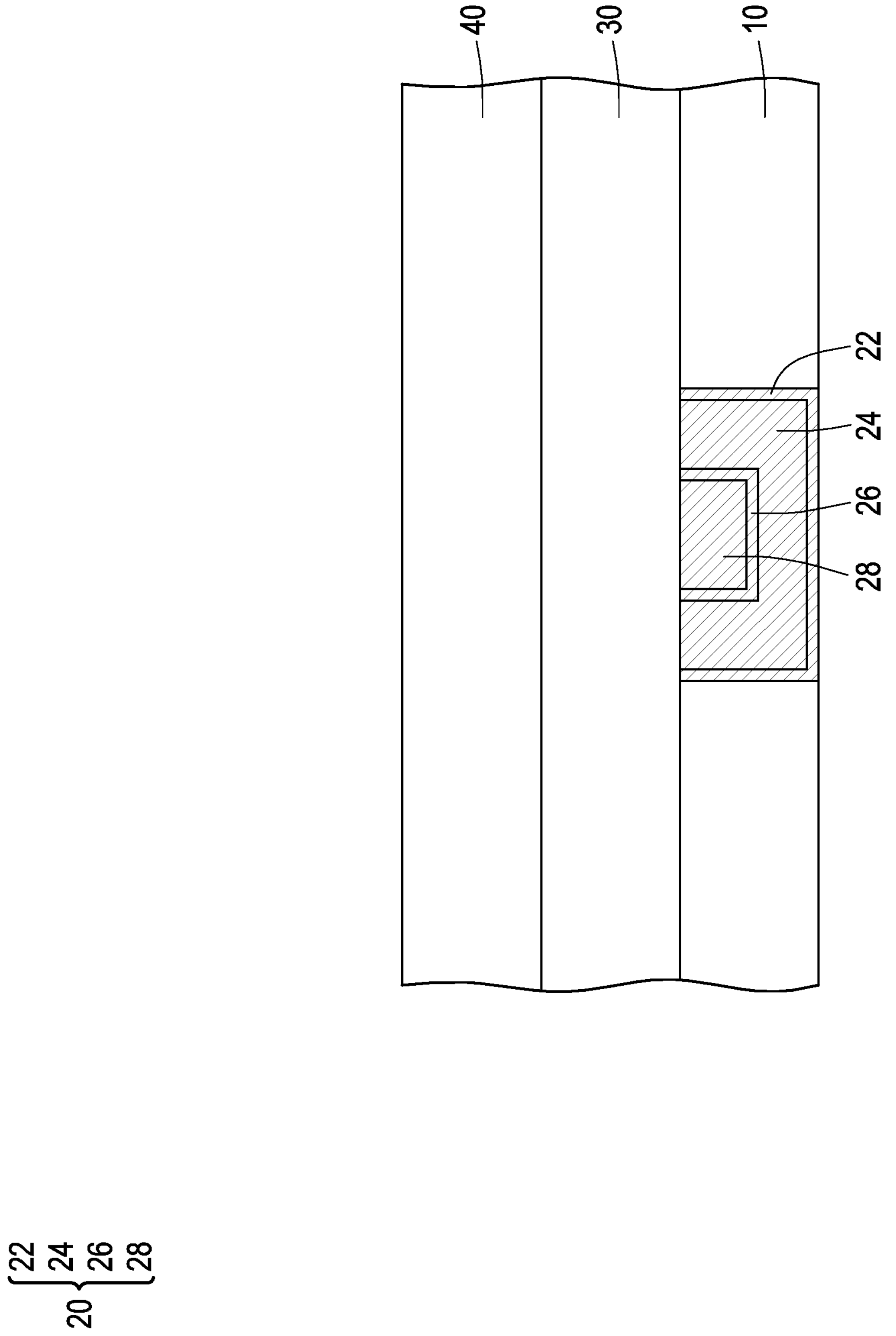
Figure 1J:
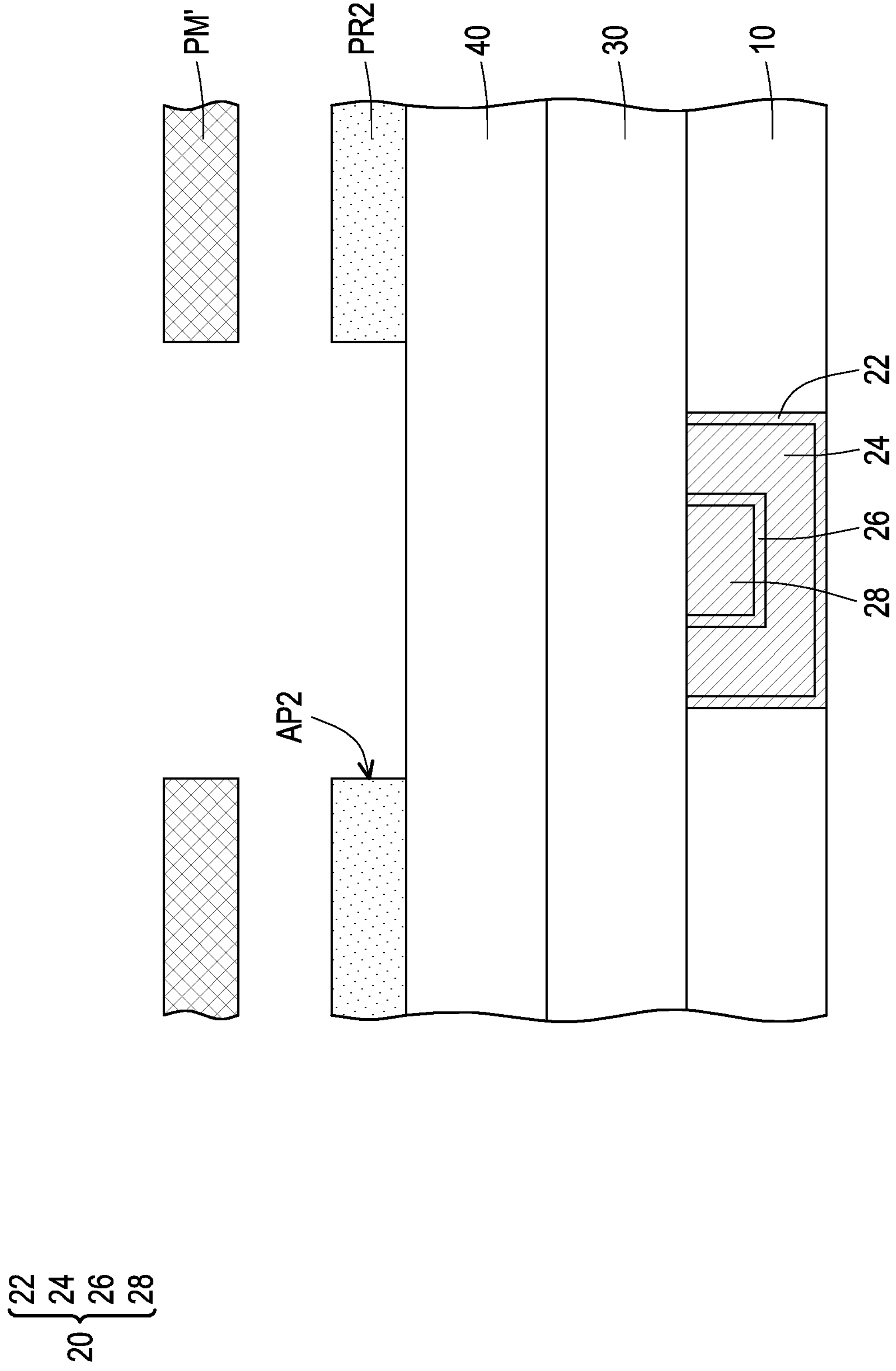
Figure 1K:
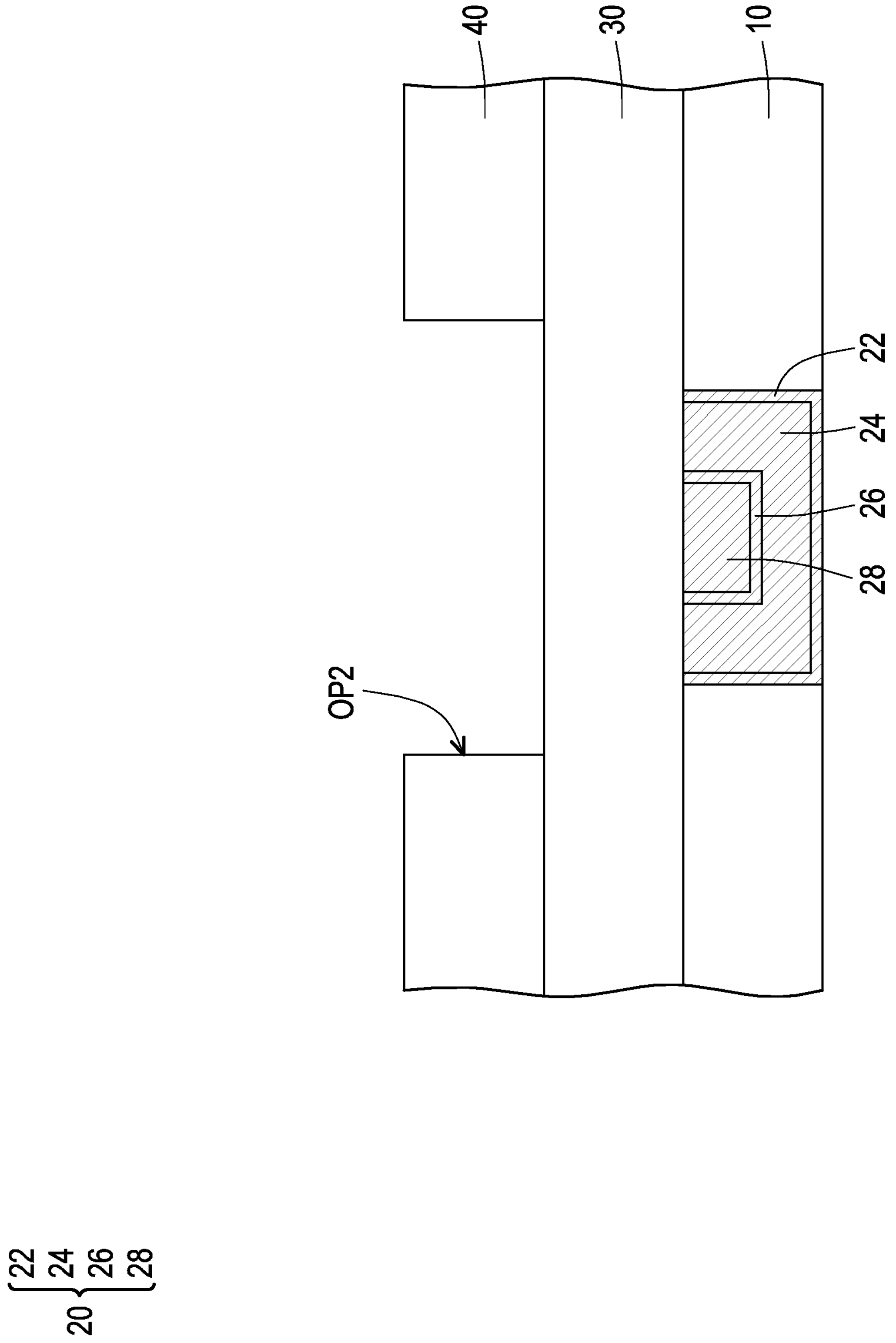
Figure 1L:
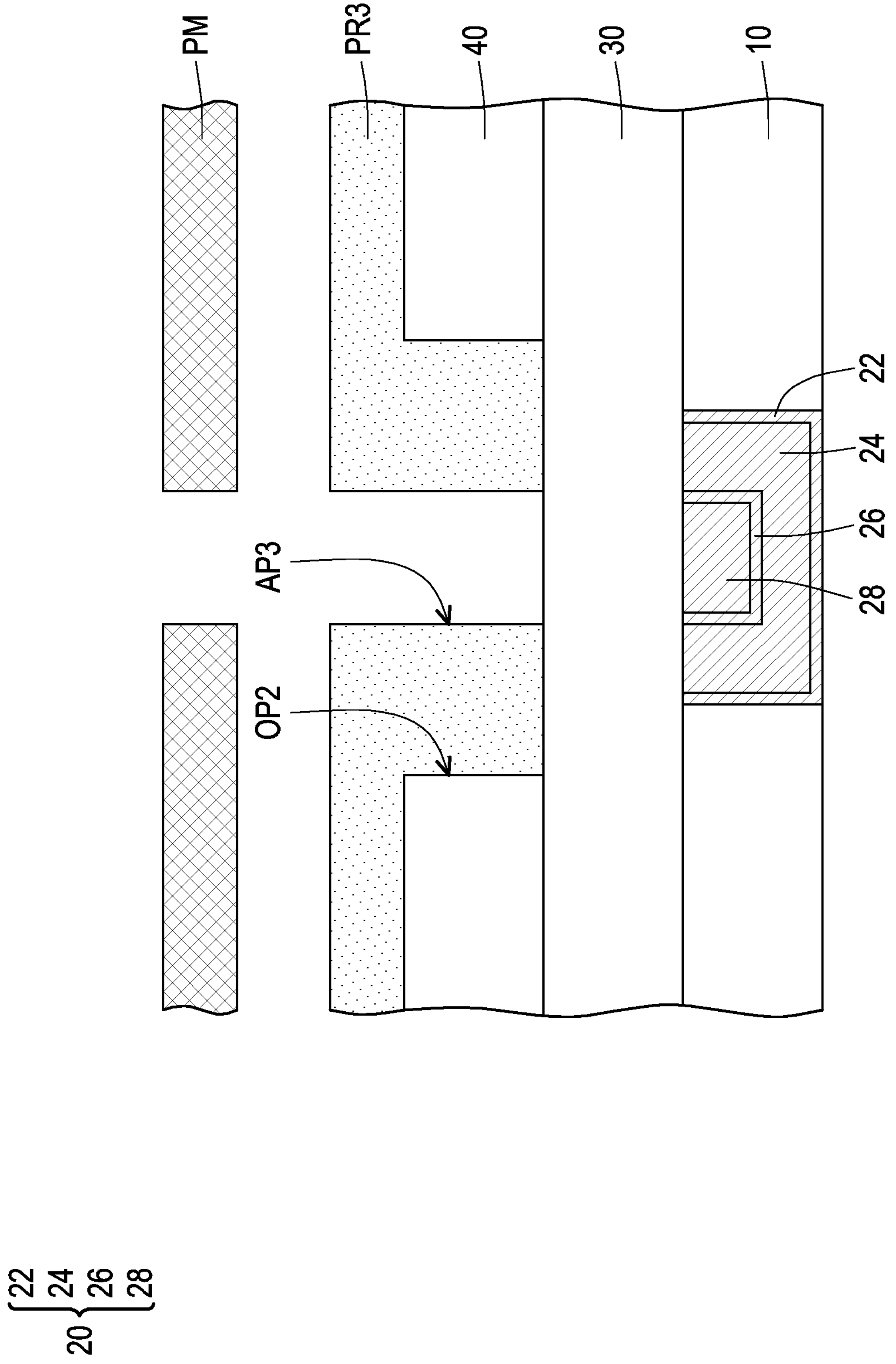
Figure 1M:
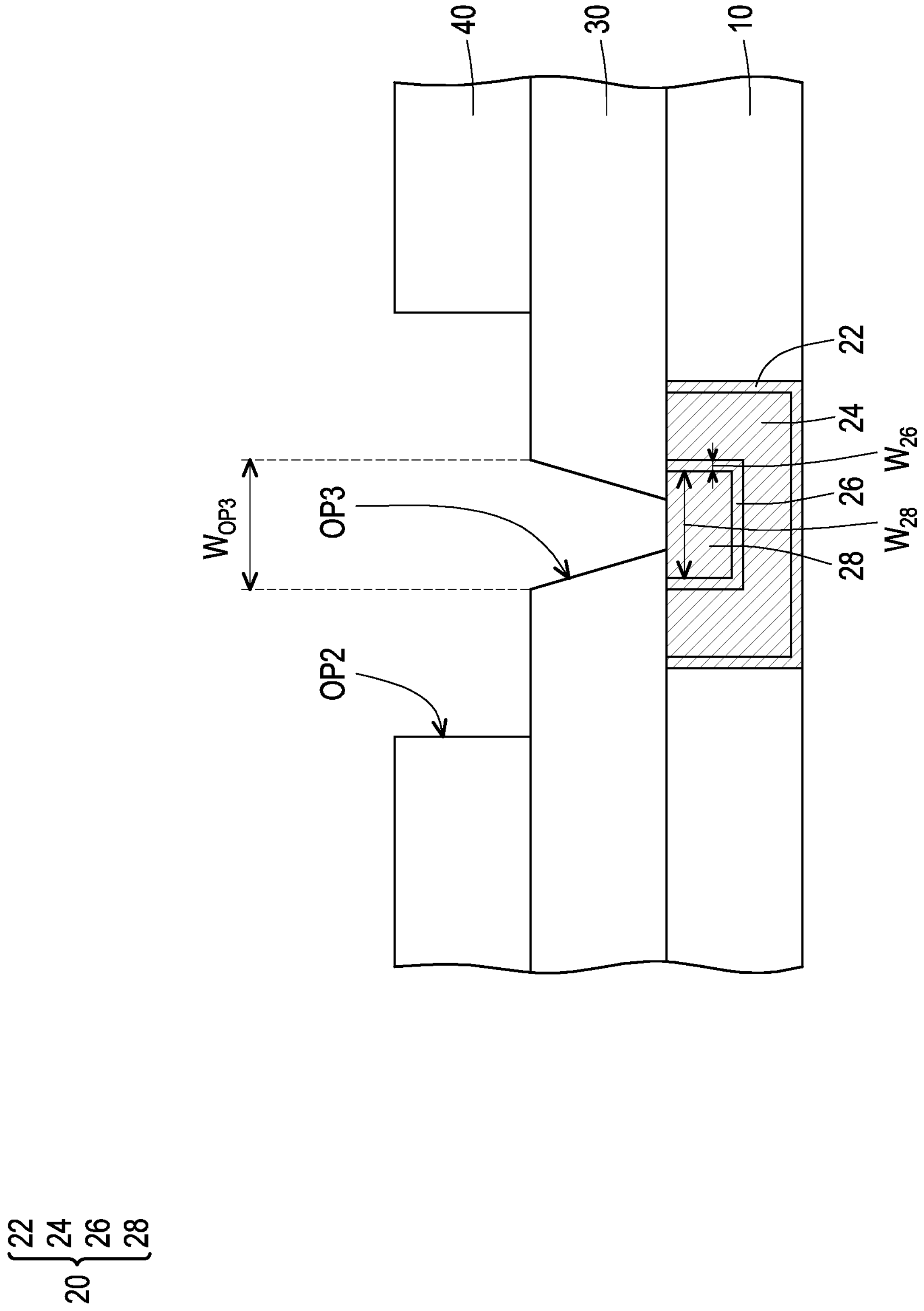
Figure 1N:
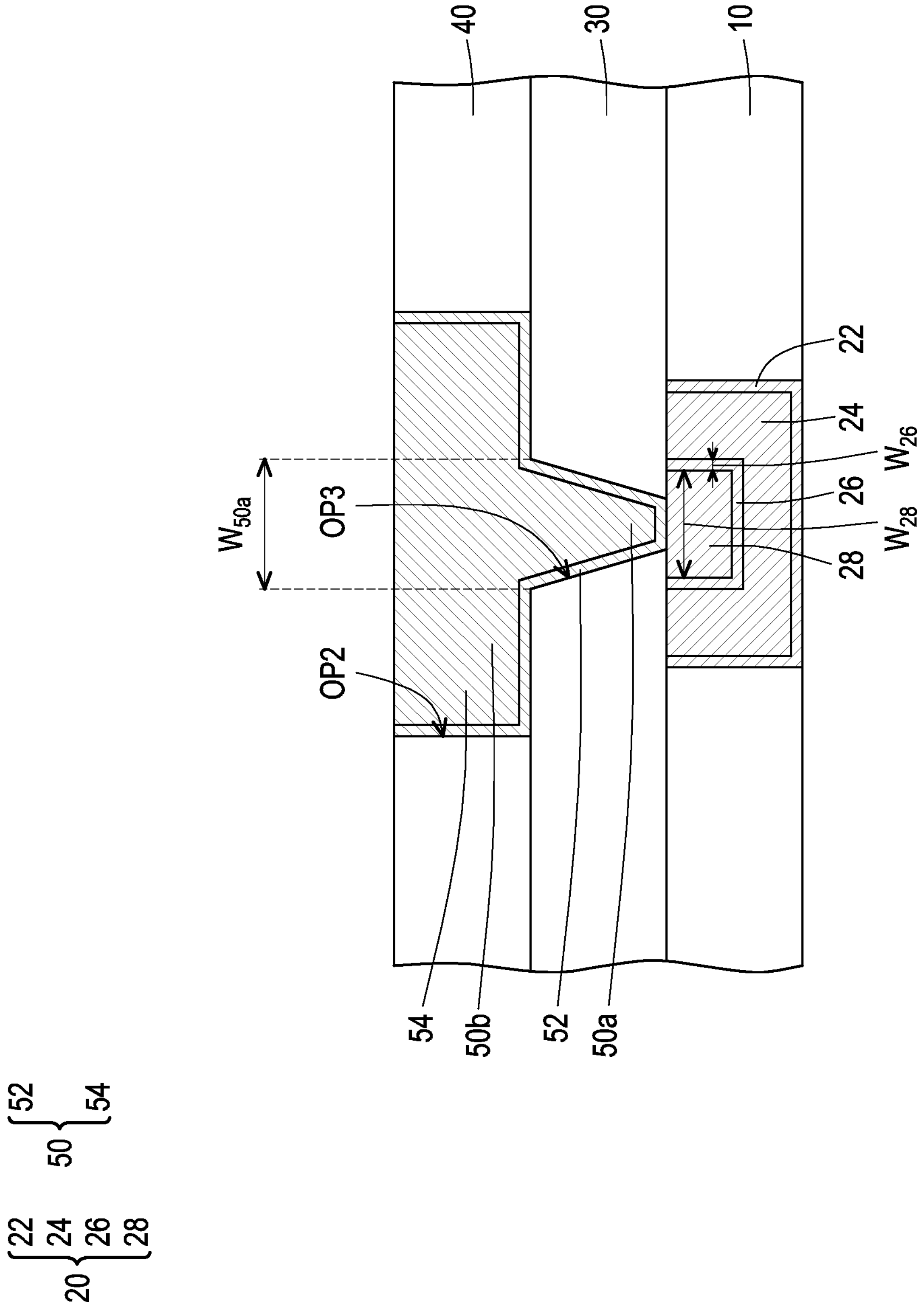

FIG. 1A to FIG. 1N are schematic cross-sectional views illustrating a method of forming patterns in accordance with some embodiments of the disclosure. Referring to FIG. 1A, a first dielectric layer 10 is provided. In some embodiments, a material of the first dielectric layer 10 includes polyimide, epoxy resin, acrylic resin, phenol resin, polybenzoxazole (PBO), carbonized silicon nitride (SiCN), silicon carbon oxynitride (SiCON), benzocyclobutene (BCB), silicon nitride (SiN), silicon oxide (SiO), silicon oxynitride (SiON), molding compound, undoped silicate glass (USG), phosphosilicate glass (PSG), borosilicate glass (BSG), boron-doped phosphosilicate glass (BPSG), metal oxides (such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO), metal nitrides (such as TiN, TaN, WN, TiAlN, TaCN), silicates (such as HfSiO, HfSiON, LaSiO, AlSiO), a combination thereof, or the like.

In some embodiments, the first dielectric layer 10 is formed by suitable fabrication techniques, such as spin-on coating, chemical vapor deposition (CVD), plasma-enhanced chemical vapor deposition (PECVD), atomic layer deposition (ALD), thermal oxidation, some other suitable deposition or growth processes, or a combination thereof. In some embodiments, the first dielectric layer 10 is formed on a substrate (not shown). Depending on the application and the location of the subsequently formed patterns, the substrate may be made of a dielectric material, a metallic material, or a semiconductor material.

Referring to FIG. 1B, a first opening OP1 is formed in the first dielectric layer 10. In some embodiments, the first dielectric layer 10 is patterned through a photolithography process and an etching process, so as to form the first opening OP1. The etching process includes, for example, a wet etching process or a dry etching process. Example of the wet etching process includes chemical etching and example of the dry etching process includes plasma etching.

Referring to FIG. 1C, a first seed material layer 22' is conformally formed on the first dielectric layer 10. For example, a first portion of the first seed material layer 22' is formed on a top surface of the first dielectric layer 10 while a second portion of the first seed material layer 22' extends into the first opening OP1 of the first dielectric layer 10. In other words, the first seed material layer 22' covers sidewalls and a bottom of the first opening OP1. In some embodiments, the first seed material layer 22' is formed through a sputtering process, a physical vapor deposition (PVD) process, or the like. In some embodiments, the first seed material layer 22' is constituted by two sub-layers (not shown). The first sub-layer may include titanium, titanium nitride, tantalum, tantalum nitride, cobalt, manganese, other suitable materials, or a combination thereof. On the other hand, the second sub-layer may include copper, copper alloys, or other suitable choice of materials.

Thereafter, a first conductive material layer 24' is formed on the first seed material layer 22'. In some embodiments, the first conductive material layer 24' also extends into the first opening OP1 of the first dielectric layer 10 to completely fill up the first opening OP1. In some embodiments, the first conductive material layer 24' is formed by a sputtering process, a PVD process, a plating process, or the like. The plating process is, for example, an electro-plating process, an electroless-plating process, an immersion plating process, or the like. In some embodiments, the first conductive material layer 24' is made of aluminum, titanium, copper, tungsten, and/or alloys thereof.

Referring to FIG. 1C and FIG. 1D, a portion of the first seed material layer 22' and a portion of the first conductive material layer 24' are removed. For example, the first seed material layer 22' and the first conductive material layer 24' shown in FIG. 1C are thinned until the underlying first dielectric layer 10 is exposed, so as to form a first seed layer 22 and a first conductive layer 24 in the first opening OP1. That is, the first seed layer 22 and the first conductive layer 24 are embedded in the first dielectric layer 10. In some embodiments, the first seed material layer 22' and the first conductive material layer 24' are thinned through a grinding process, an etching process, or the like. The grinding process includes, for example, a mechanical grinding process, a chemical mechanical polishing (CMP) process, or the like. As illustrated in FIG. 1D, the first seed layer 22 surrounds the first conductive layer 24. For example, the first seed layer 22 exhibits a U-shape in the cross-sectional view of FIG. 1D to surround the first conductive layer 24. That is, the first seed layer 22 covers sidewalls and a bottom surface of the first conductive layer 24.

Referring to FIG. 1E, a patterned photoresist layer PR1 is formed on the first dielectric layer 10, the first seed layer 22, and the first conductive layer 24. In some embodiments, the patterned photoresist layer PR1 is made of a photosensitive material. In some embodiments, the patterned photoresist layer PR1 is formed by performing an exposure process and a development process on a photoresist layer (not shown) using a photomask PM as a mask. That is, the patterns on the photomask PM is transferred onto the patterned photoresist layer PR1. For example, as shown in FIG. 1E, the patterned photoresist layer PR1 has a first aperture AP1 exposing a portion of the first conductive layer 24.

Referring to FIG. 1E and FIG. 1F, a portion of the first conductive layer 24 is removed to form a recess R. For example, an etching process may be performed on the first conductive layer 24 using the patterned photoresist layer PR1 as a mask to form the recess R in the first conductive layer 24. That is, the location of the recess R corresponds to the location of the first aperture AP1 of the patterned photoresist layer PR1. In some embodiments, the etching process includes, for example, a wet etching process or a dry etching process. Example of the wet etching process includes chemical etching and example of the dry etching process includes plasma etching. After the recess R is formed, the patterned photoresist layer PR1 is removed through a dry stripping process, a wet stripping process, or other suitable processes.

As illustrated in FIG. 1F, the recess R has substantially vertical sidewalls. Meanwhile, a bottom of the recess R is substantially flat. In other words, the recess R exhibits a rectangular shape in the cross-sectional view of FIG. 1F. However, the disclosure is not limited thereto. Depending on different etching processes or etching recipes, the recess R may have different profiles in the cross-sectional view. Alternative shapes of the recess R will be described below in conjunction with FIG. 2A and FIG. 2B.

Figure 2A:
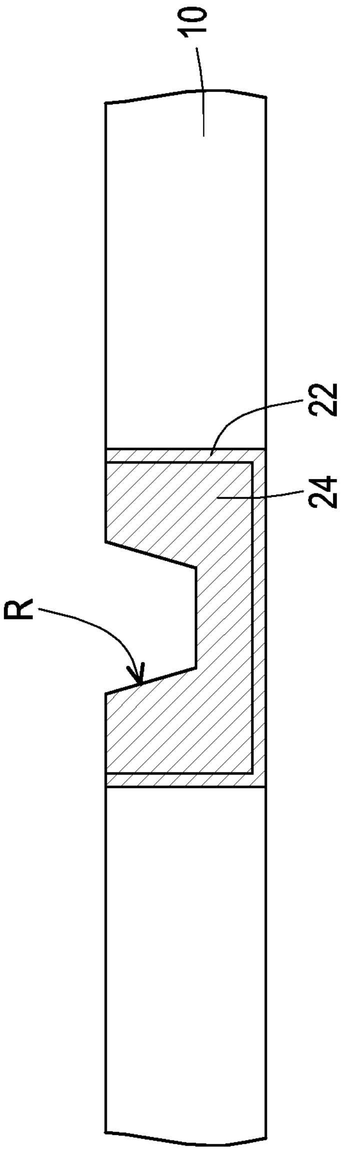
FIG. 2A and FIG. 2B are respectively a schematic cross-sectional view of FIG. 1F in accordance with some alternative embodiments of the disclosure.
Figure 2B:
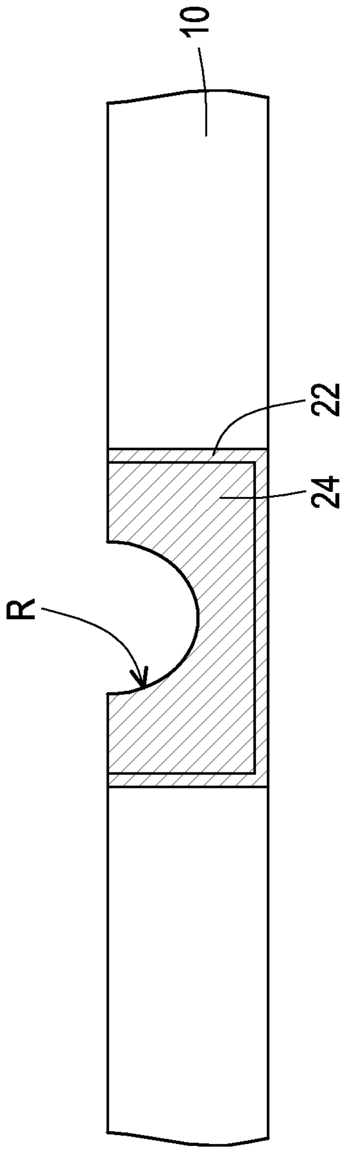

FIG. 2A and FIG. 2B are respectively a schematic cross-sectional view of FIG. 1F in accordance with some alternative embodiments of the disclosure. Referring to FIG. 2A, the recess R has slanted sidewalls. Meanwhile, a bottom of the recess R is substantially flat. In other words, the recess R exhibits a trapezoidal shape in the cross-section view of FIG. 2A. Referring to FIG. 2B, the recess has curved sidewalls. Meanwhile, a bottom of the recess R is also curved. In other words, the recess R exhibits a hemispherical shape in the cross-sectional view of FIG. 2B.

Depending on the shape of the patterns on the photomask PM and the shape of the first aperture AP1 of the patterned photoresist layer PR1, the recess R may exhibit different shapes from the top view. The top views of the recess R will be described below in conjunction with FIG. 3A to FIG. 3C.

Figure 3A:
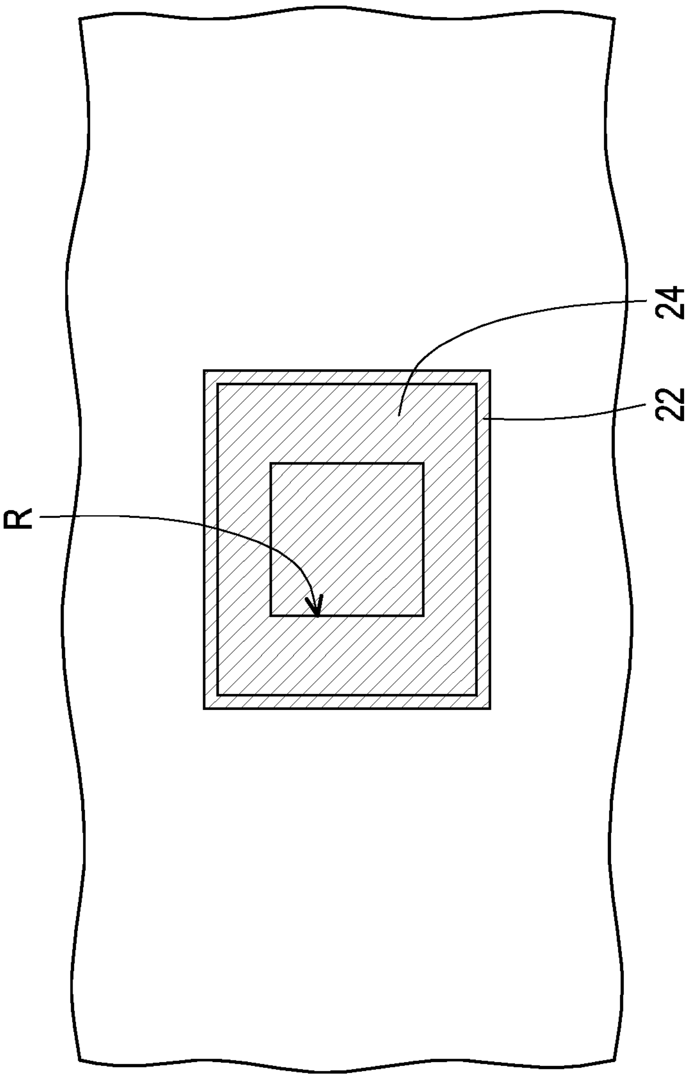
FIG. 3A to FIG. 3C are respectively a top view of the structure in FIG. 1F in accordance with various embodiments of the disclosure.
Figure 3B:
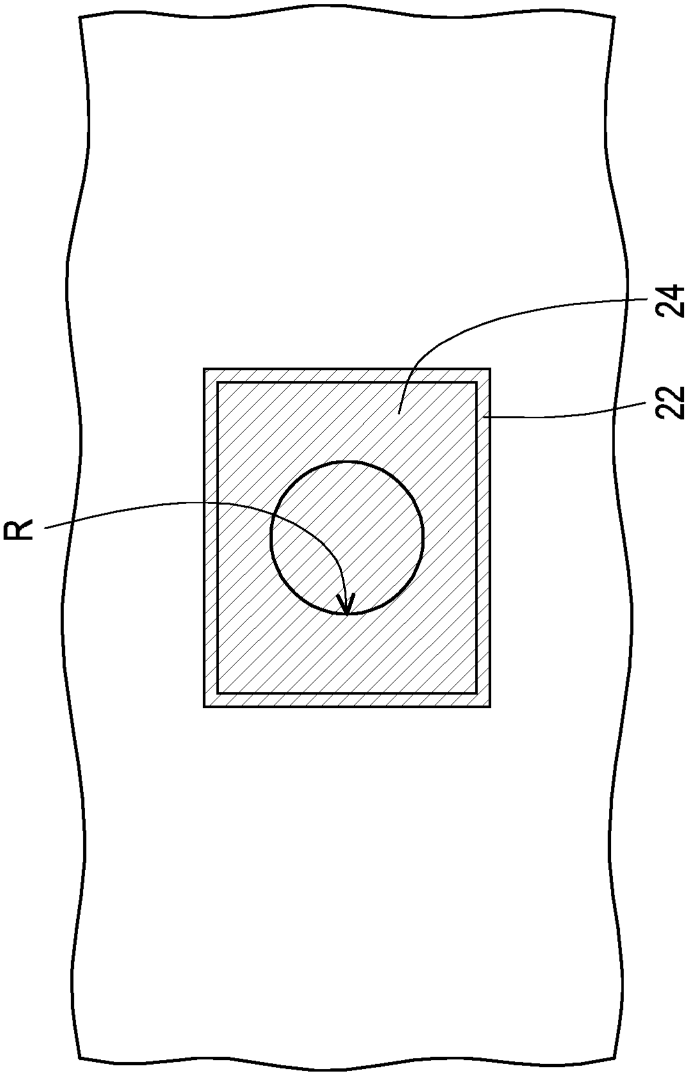
Figure 3C:
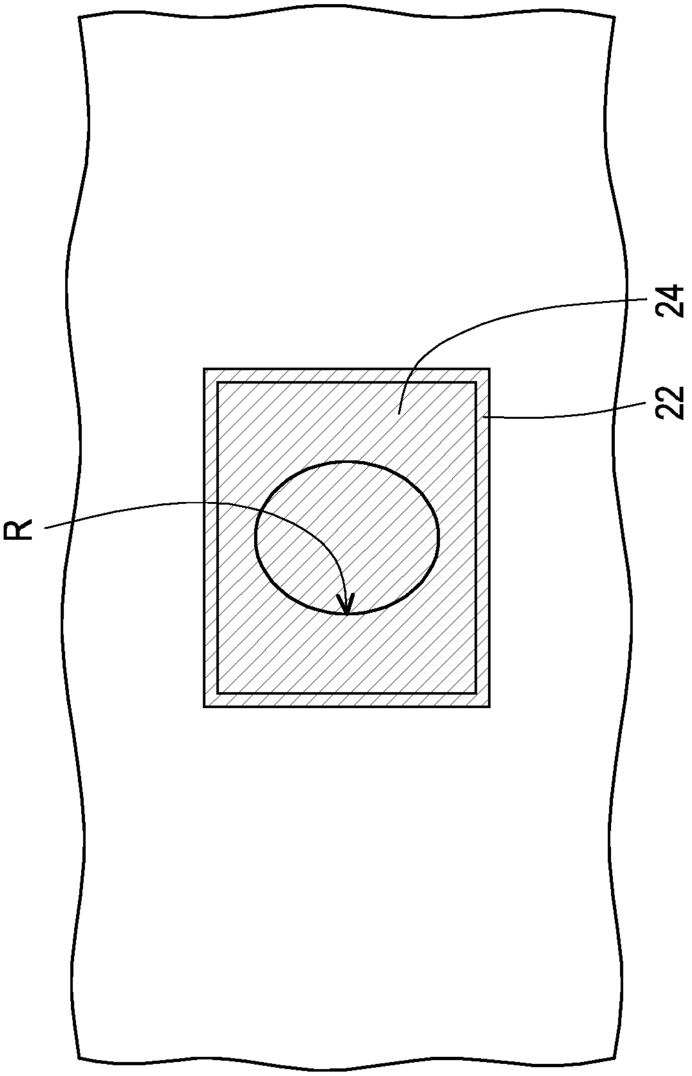

FIG. 3A to FIG. 3C are respectively a top view of the structure in FIG. 1F in accordance with various embodiments of the disclosure. Referring to FIG. 3A, the recess R exhibits a rectangular shape from the top view. For example, the recess R may be a rectangle or a square from the top view. Referring to FIG. 3B, the recess exhibits a circular shape from the top view. For example, the recess R may be a circle from the top view. Referring to FIG. 3C, the recess exhibits an elliptical shape from the top view. For example, the recess R may be an ellipse from the top view.

Referring to FIG. 1G, a vacancy migration blocking material layer 26' is conformally formed on the first dielectric layer 10, the first seed layer 22, and the first conductive layer 24. For example, a first portion of the vacancy migration blocking material layer 26' is formed on a top surface of first dielectric layer 10, a top surface of the first seed layer 22, and a topmost surface of the first conductive layer 24 while a second portion of the vacancy migration blocking material layer 26' extends into the recess R. In other words, the vacancy migration blocking material layer 26' covers sidewalls and a bottom surface of the recess R. In some embodiments, the vacancy migration blocking material layer 26' is formed through a sputtering process, a PVD process, or the like. In some embodiments, the vacancy migration blocking material layer 26' is constituted by two sub-layers (not shown). The first sub-layer may include titanium, titanium nitride, tantalum, tantalum nitride, cobalt, manganese, other suitable materials, or a combination thereof. On the other hand, the second sub-layer may include copper, copper alloys, or other suitable choice of materials.

Thereafter, a second conductive material layer 28' is formed on the vacancy migration blocking material layer 26'. In some embodiments, the second conductive material layer 28' also extends into the recess R to completely fill up the recess R. In some embodiments, the second conductive material layer 28' is formed by a sputtering process, a PVD process, a plating process, or the like. The plating process is, for example, an electro-plating process, an electroless-plating process, an immersion plating process, or the like. In some embodiments, the second conductive material layer 28' is made of aluminum, titanium, copper, tungsten, and/or alloys thereof. In some embodiments, the vacancy migration blocking material layer 26' may serve as a seed layer for depositing the second conductive material layer 28'.

Referring to FIG. 1G and FIG. 1H, a portion of the vacancy migration blocking material layer 26' and a portion of the second conductive material layer 28' are removed. For example, the vacancy migration blocking material layer 26' and the second conductive material layer 28' shown in FIG. 1G are thinned until the underlying first dielectric layer 10, the underlying first seed layer 22, and the underlying first conductive layer 24 are exposed, so as to form a vacancy migration blocking layer 26 and a second conductive layer 28 in the recess R. In some embodiments, the vacancy migration blocking material layer 26' and the second conductive material layer 28' are thinned through a grinding process, an etching process, or the like. The grinding process includes, for example, a mechanical grinding process, a CMP process, or the like.

In some embodiments, the vacancy migration blocking layer 26 surrounds the second conductive layer 28. For example, the vacancy migration blocking layer 26 exhibits a U-shape in the cross-sectional view of FIG. 1H to surround the second conductive layer 28. That is, the vacancy migration blocking layer 26 covers sidewalls and a bottom surface of the second conductive layer 28. As illustrated in FIG. 1H, the vacancy migration blocking layer 26 and the second conductive layer 28 are embedded in the first conductive layer 24. For example, the vacancy migration blocking layer 26 is spatially separated from the first seed layer 22. In some embodiments, the first conductive layer 24 is sandwiched between the first seed layer 22 and the vacancy migration blocking layer 26. Meanwhile, the vacancy migration blocking layer 26 is sandwiched between the first conductive layer 24 and the second conductive layer 28.

In some embodiments, a material of the first seed layer 22 is the same as a material of the vacancy migration blocking layer 26. However, the disclosure is not limited thereto. In some alternative embodiments, the material of the first seed layer 22 is different from the material of the vacancy migration blocking layer 26. For example, the first seed layer 22 is constituted by two sub-layers (not shown). The first sub-layer of the first seed layer 22 may include titanium, titanium nitride, tantalum, tantalum nitride, cobalt, manganese, other suitable materials, or a combination thereof. On the other hand, the second sub-layer of the first seed layer 22 may include copper, copper alloys, or other suitable choice of materials. Similarly, the vacancy migration blocking layer 26 is also constituted by two sub-layers (not shown). The first sub-layer of the vacancy migration blocking layer 26 may include titanium, titanium nitride, tantalum, tantalum nitride, cobalt, manganese, other suitable materials, or a combination thereof. On the other hand, the second sub-layer of the vacancy migration blocking layer 26 may include copper, copper alloys, or other suitable choice of materials.

In some embodiments, a material of the first conductive layer 24 is the same as a material of the second conductive layer 28. However, the disclosure is not limited thereto. In some alternative embodiments, the material of the first conductive layer 24 is different from the material of the second conductive layer 28. For example, the first conductive layer 24 and the second conductive layer 28 are respectively made of aluminum, titanium, copper, tungsten, and/or alloys thereof. In certain embodiments, the material of the first conductive layer 24 and the material of the second conductive layer 28 include copper.

In some embodiments, the first seed layer 22, the first conductive layer 24, the vacancy migration blocking layer 26, and the second conductive layer 28 are collectively referred to as a first pattern 20. As illustrated in FIG. 1H, the first pattern 20 completely fills up the first opening OP1. In other words, the first pattern 20 is embedded in the first dielectric layer 10.

Referring to FIG. 1I, a second dielectric layer 30 and a third dielectric layer 40 are sequentially deposited on the first dielectric layer 10 and the first pattern 20. A material of the second dielectric layer 30 and a material of the third dielectric layer 40 may be the same or different from the material of the first dielectric layer 10. For example, the material of the second dielectric layer 30 and the material of the third dielectric layer 40 include polyimide, epoxy resin, acrylic resin, phenol resin, PBO, SiCN, SiCON, BCB, SiN, SiO, SiON, molding compound, USG, PSG, BSG, BPSG, metal oxides (such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO), metal nitrides (such as TiN, TaN, WN, TiAlN, TaCN), silicates (such as HfSiO, HfSiON, LaSiO, AlSiO), a combination thereof, or the like.

In some embodiments, the second dielectric layer 30 and the third dielectric layer 40 are formed by suitable fabrication techniques, such as spin-on coating, CVD, PECVD, ALD, thermal oxidation, some other suitable deposition or growth processes, or a combination thereof.

Referring to FIG. 1J, a patterned photoresist layer PR2 is formed on the third dielectric layer 40. In some embodiments, the patterned photoresist layer PR2 is made of a photosensitive material. In some embodiments, the patterned photoresist layer PR2 is formed by performing an exposure process and a development process on a photoresist layer (not shown) using a photomask PM' as a mask. That is, the patterns on the photomask PM' is transferred onto the patterned photoresist layer PR2. For example, as shown in FIG. 1J, the patterned photoresist layer PR2 has a second aperture AP2 exposing a portion of the third dielectric layer 40.

Referring to FIG. 1J and FIG. 1K, a portion of the third dielectric layer 40 is removed to form a second opening OP2 in the third dielectric layer 40. For example, an etching process may be performed on the third dielectric layer 40 using the patterned photoresist layer PR2 as a mask to form the second opening OP2. That is, the location of the second opening OP2 corresponds to the location of the second aperture AP2 of the patterned photoresist layer PR2. In some embodiments, the etching process includes, for example, a wet etching process or a dry etching process. Example of the wet etching process includes chemical etching and example of the dry etching process includes plasma etching. After the second opening OP2 is formed, the patterned photoresist layer PR2 is removed through a dry stripping process, a wet stripping process, or other suitable processes.

Referring to FIG. 1L, a patterned photoresist layer PR3 is formed on the second dielectric layer 30 and the third dielectric layer 40. In some embodiments, the patterned photoresist layer PR3 extends into the second opening OP2 of the third dielectric layer 40. In some embodiments, the patterned photoresist layer PR3 is made of a photosensitive material. In some embodiments, the patterned photoresist layer PR3 is formed by performing an exposure process and a development process on a photoresist layer (not shown) using the photomask PM as a mask. That is, the patterns on the photomask PM is transferred onto the patterned photoresist layer PR3. For example, as shown in FIG. 1L, the patterned photoresist layer PR3 has a third aperture AP3 exposing a portion of the second dielectric layer 30. In some embodiments, the photomask PM in FIG. 1L is the same as the photomask PM in FIG. 1E. In other words, the dimension and the shape of the second aperture AP3 of the patterned photoresist layer PR3 in FIG. 1L are identical to the dimension and the shape of the first aperture AP1 of the patterned photoresist layer PR1 in FIG. 1E. In some embodiments, the third aperture AP3 of the patterned photoresist layer PR3 in FIG. 1L is smaller than the second aperture AP2 of the patterned photoresist layer PR2 in FIG. 1J.

Referring to FIG. 1L and FIG. 1M, a portion of the second dielectric layer 30 is removed to form a third opening OP3 in the second dielectric layer 30. For example, an etching process may be performed on the second dielectric layer 30 using the patterned photoresist layer PR3 as a mask to form the third opening OP3. That is, the location of the third opening OP3 corresponds to the location of the third aperture AP3 of the patterned photoresist layer PR3. In some embodiments, the etching process includes, for example, a wet etching process or a dry etching process. Example of the wet etching process includes chemical etching and example of the dry etching process includes plasma etching. After the third opening OP3 is formed, the patterned photoresist layer PR3 is removed through a dry stripping process, a wet stripping process, or other suitable processes. As illustrated in FIG. 1M, the third opening OP3 penetrates through the second dielectric layer 30 to expose a portion of the second conductive layer 28. Meanwhile, the second opening OP2 exposes the third opening OP3.

In some embodiments, due to a higher aspect ratio, the etching rate at the bottom of the second dielectric layer 30 may be slower than the etching rate at the top of the second dielectric layer 30. As a result, the third opening OP3 is formed to have slanted sidewalls, as shown in FIG. 1M. As mentioned above, since the step of removing the portion of the first conductive layer 24 (shown in FIG. 1E and FIG. 1F) and the step of removing the portion of second dielectric layer 30 (shown in FIG. 1L and FIG. 1M) use the same photomask PM, the dimension of the third opening OP3 may be the same as or slightly smaller than the dimension of the recess R (shown in FIG. 1F). In other words, a maximum width $W_{OP3}$ of the third opening OP3 is equal to or less than a sum of a width $W_{28}$ of the second conductive layer 28 and a width $W_{26}$ of the vacancy migration blocking layer 26.

Referring to FIG. 1N, a second seed layer 52 and a third conductive layer 54 are deposited into the second opening OP2 and the third opening OP3. In some embodiments, the second seed layer 52 is formed through a sputtering process, a PVD process, or the like. In some embodiments, the second seed layer 52 is constituted by two sub-layers (not shown). The first sub-layer may include titanium, titanium nitride, tantalum, tantalum nitride, cobalt, manganese, other suitable materials, or a combination thereof. On the other hand, the second sub-layer may include copper, copper alloys, or other suitable choice of materials. In some embodiments, the third conductive layer 54 is formed by a sputtering process, a PVD process, a plating process, or the like. The plating process is, for example, an electro-plating process, an electroless-plating process, an immersion plating process, or the like. In some embodiments, the third conductive layer 54 is made of aluminum, titanium, copper, tungsten, and/or alloys thereof. In some embodiments, the second seed layer 52 and the third conductive layer 54 are formed by the following steps. First, a second seed material layer (not shown) and a third conductive material layer (not shown) are formed on the third dielectric layer 40 and in the second opening OP2 and the third opening OP3. Thereafter, the second seed material layer and the third conductive material layer are thinned until the underlying third dielectric layer 40 is exposed, so as to form the second seed layer 52 and the third conductive layer 54 in the second opening OP2 and the third opening OP3. In some embodiments, the second seed material layer and the third conductive material layer are thinned through a grinding process, an etching process, or the like. The grinding process includes, for example, a mechanical grinding process, a CMP process, or the like.

As illustrated in FIG. 1N, the second seed layer 52 surrounds the third conductive layer 54. For example, the second seed layer 52 covers sidewalls and a bottom surface of the third conductive layer 54. In some embodiments, the third conductive layer 54 exhibits a T-shape in the cross-sectional view of FIG. 1N. In some embodiments, the second seed layer 52 and the third conductive layer 54 are collectively referred to as a second pattern 50. As illustrated in FIG. 1N, the second pattern 50 completely fills up the second opening OP2 and the third opening OP3. In other words, the second pattern 50 is embedded in the second dielectric layer 30 and the third dielectric layer 40.

In some embodiments, the process shown in FIG. 1J to FIG. 1N may be referred to as a "dual damascene" process. For example, the second pattern 50 may be divided into a via portion 50*a* and a line portion 50*b* disposed on the via portion 50*a*. In some embodiments, the via portion 50*a* corresponds to the second seed layer 52 and the third conductive layer 54 located within the third opening OP3. Meanwhile, the line portion 50*b* corresponds to the second seed layer 52 and the third conductive layer 54 located within the second opening OP2. In other words, the via portion 50*a* is embedded in the second dielectric layer 30 and the line portion 50*b* is embedded in the third dielectric layer 40. In some embodiments, the via portion 50*a* is connected to the line portion 50*b*. As illustrated in FIG. 1N, the second pattern 50 is in physical contact with the first pattern 20. For example, the via portion 50*a* of the second pattern 50 is in physical contact with the second conductive layer 28 of the first pattern 20. As mentioned above, the dimension of the third opening OP3 may be the same as or slightly smaller than the dimension of the recess R (shown in FIG. 1F). Since the via portion 50*a* is formed by filling up the third opening OP3, a maximum width $W_{50a}$ of the via portion 50*a* is equal to or less than the sum of the width $W_{28}$ of the second conductive layer 28 and the width $W_{26}$ of the vacancy migration blocking layer 26. As illustrated in FIG. 1N, the second pattern 50 is landed on a span of the second conductive layer 28 of the first pattern 20. For example, the via portion 50*a* of the second pattern 50 is landed on a span of the second conductive layer 28 of the first pattern 20. In some embodiments, the via portion 50*a* is completely located within a span of the vacancy migration blocking layer 26 and the second conductive layer 28. For example, an edge of the via portion 50*a* does not extend beyond an outer edge of the vacancy migration blocking layer 26 in a top view. In some embodiments, a contour of the via portion 50*a* is completely overlapped with an outer contour of the vacancy migration blocking layer 26 in the top view. However, the disclosure is not limited thereto. In some alternative embodiments, the contour of the via portion 50*a* may be located within a boundary defined by the outer contour of the vacancy migration blocking layer 26 in the top view.

In some embodiments, the first conductive layer 24 and the second conductive layer 28 have intrinsic vacancies in the material thereof. When the dual damascene process is performed to form the second pattern 50 on the first pattern 20, the vacancies within the first conductive layer 24 and the second conductive layer 28 are likely to migrate to an interface between the first pattern 20 and the second pattern 50 due to tensile stress originated by thermal expansion mismatch. The vacancies would then cluster at the interface between the first pattern 20 and the second pattern 50 to form voids, thereby causing connection failure between the first pattern 20 and the second pattern 50. However, as shown in FIG. 1N, the first pattern 20 has the vacancy migration blocking layer 26 sandwiched between the first conductive layer 24 and the second conductive layer 28. The vacancy migration blocking layer 26 may sufficiently block the vacancies in the first conductive layer 24 from arriving at the interface between the first pattern 20 and the second pattern 50. In other words, the vacancies of the first conductive layer 24 would cluster around the vacancy migration blocking layer 26, which does not affect the connection between the first pattern 20 and the second pattern 50. Although some vacancies of the second conductive layer 28 may migrate to the interface between the first pattern 20 and the second pattern 50, due to the small dimension of the second conductive layer 28, the amount of these vacancies can be negligible. As such, the vacancies in the second conductive layer 28 would not form voids big enough to cause connection failure between the first pattern 20 and the second pattern 50. In sum, the vacancy migration blocking layer 26 in the first pattern 20 is able to resolve the issue of connection failure between the first pattern 20 and the second pattern 50 caused by vacancy migration, so as to enhance the reliability of the devices having the first pattern 20 and the second pattern 50.

In some embodiments, the patterns forming method illustrated in FIG. 1A to FIG. 1N may be adopted in various applications. In some embodiments, this patterns forming method may be utilized in forming conductive features in a package. For example, the conductive patterns in an interconnection structure within a die of the package or the conductive patterns in a redistribution structure of the package may be formed by this method. Alternatively, this patterns forming method may also be utilized in forming conductive features in a field effect transistor (FET). For example, gate contacts of a FET may be formed by this method. It should be noted that the elements listed above merely serve as exemplary illustrations, and the disclosure is not limited thereto. The patterns forming method shown above may also be suitable in forming any other patterns. The adoption of the foregoing patterns forming method in a redistribution structure of a package is exemplified below.

Figure 4A:
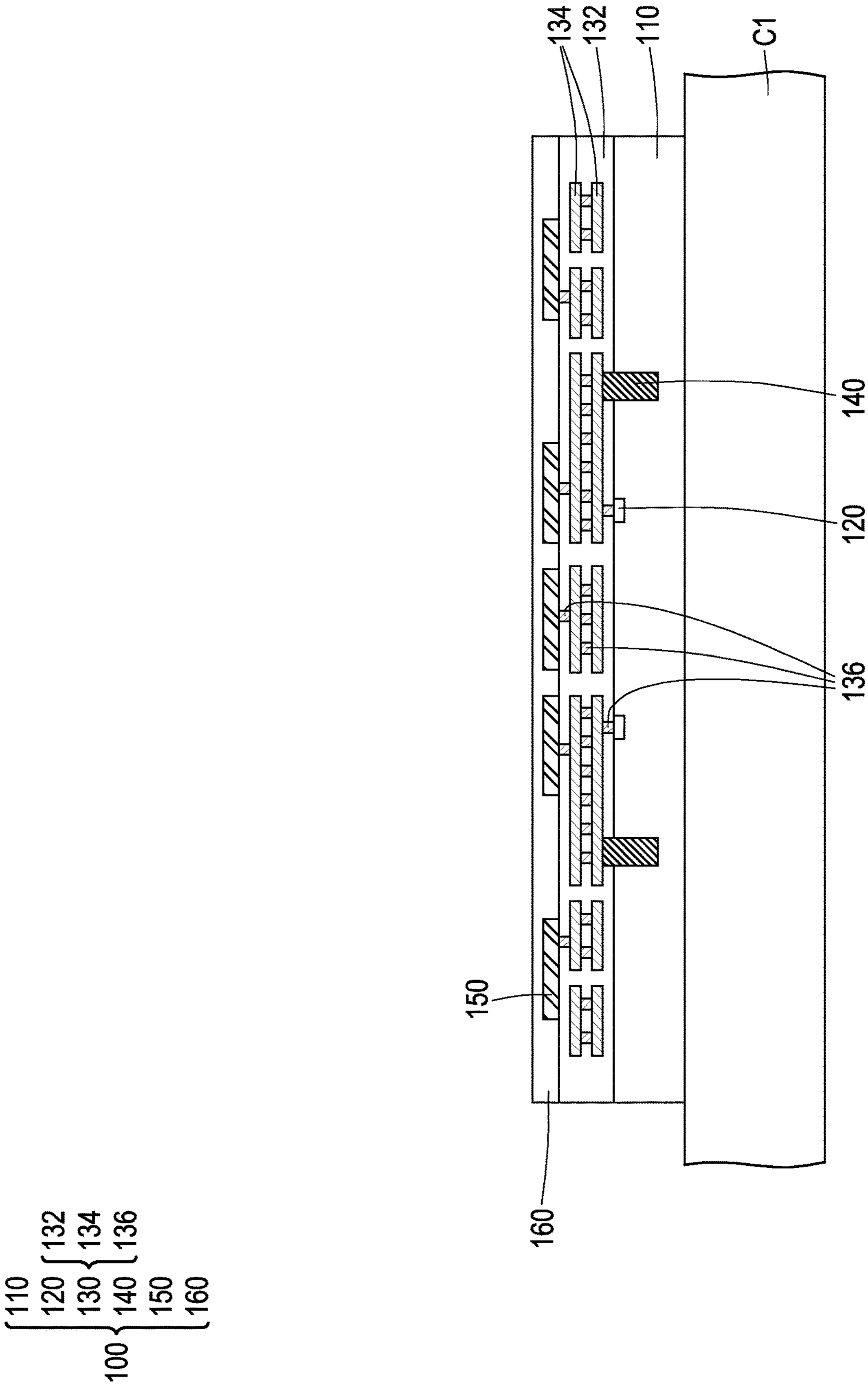
FIG. 4A to FIG. 4N are schematic cross-sectional views illustrating a manufacturing process of a package in accordance with some embodiments of the disclosure.
Figure 4B:
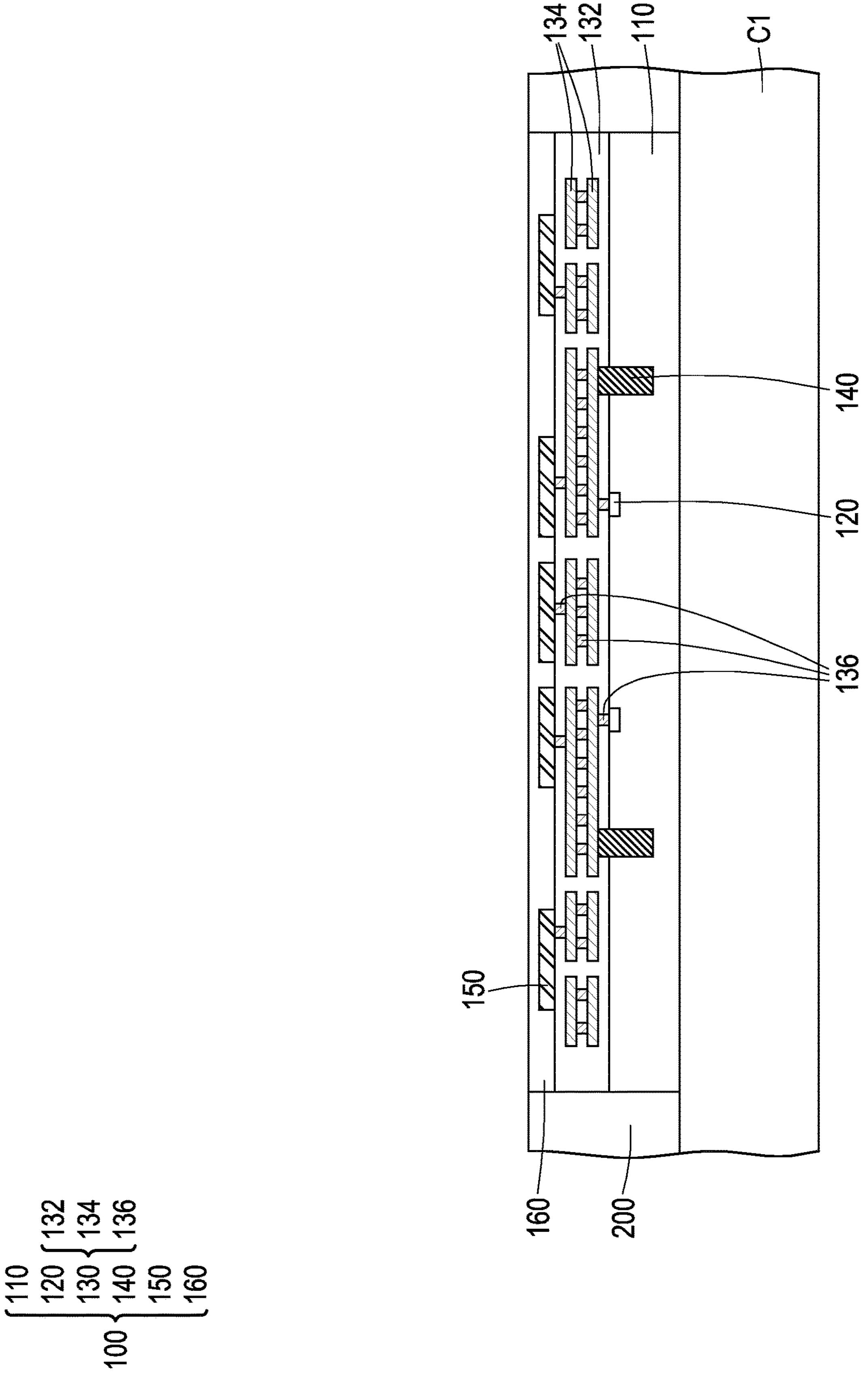
Figure 4C:
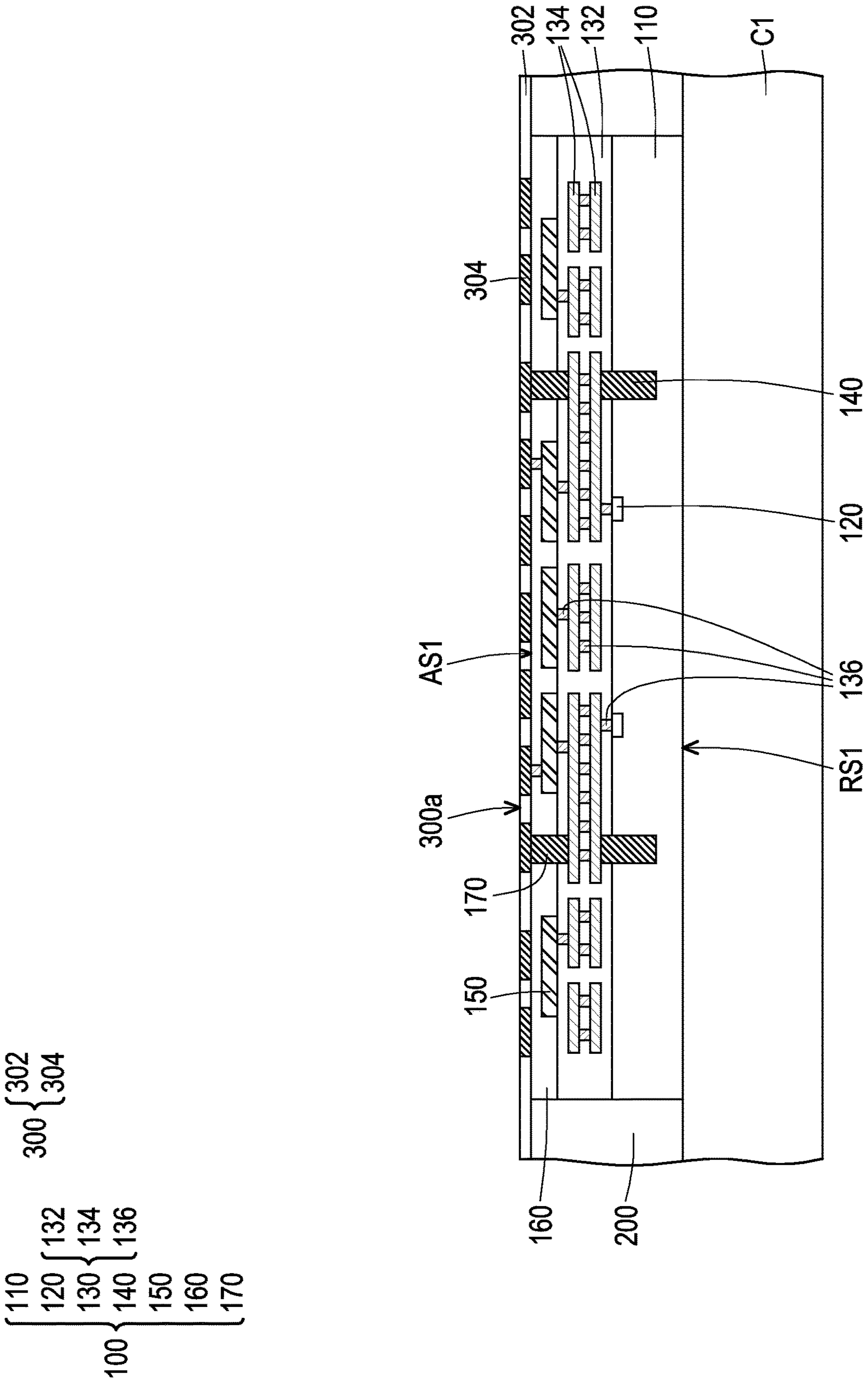
Figure 4D:
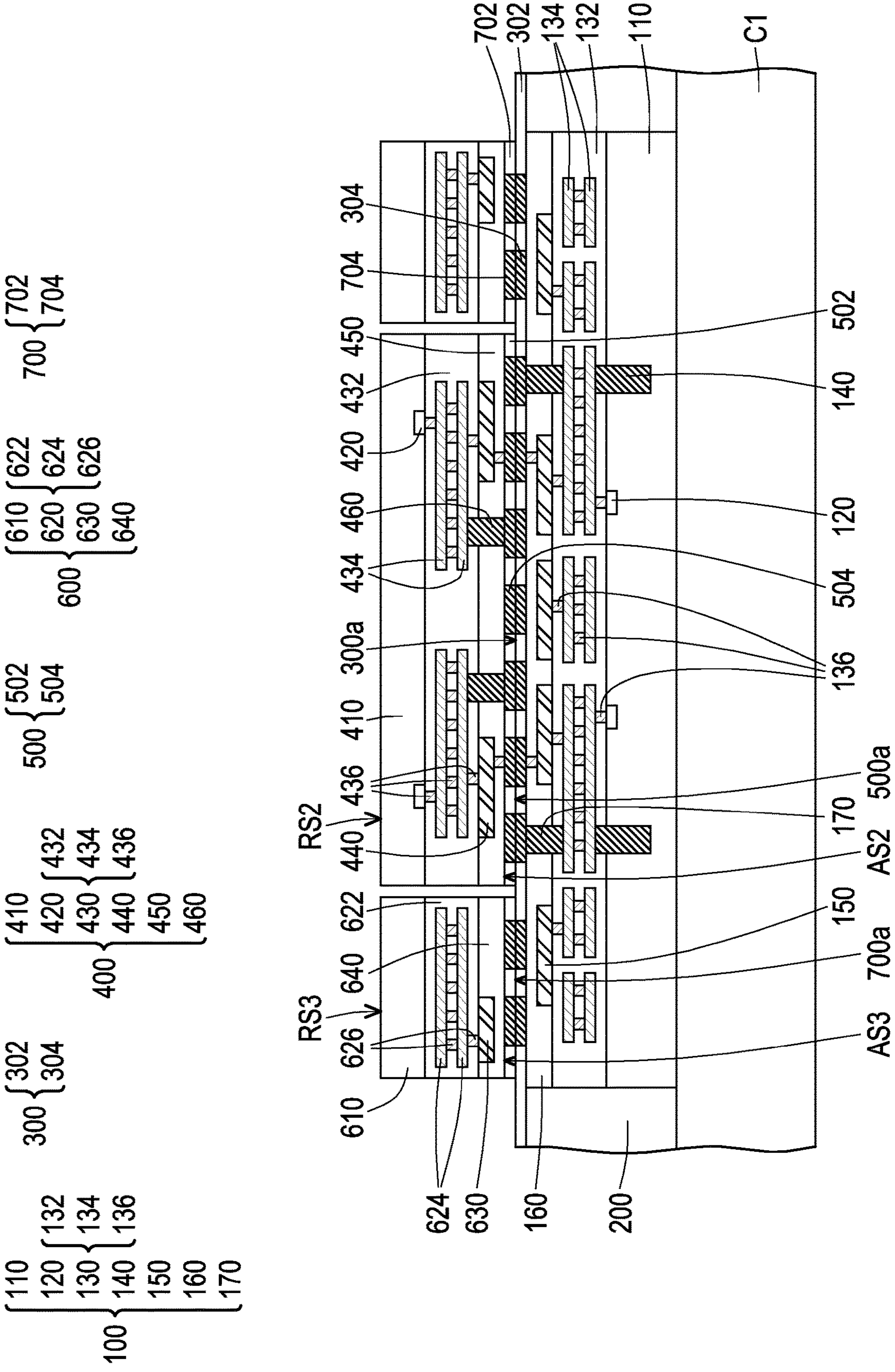
Figure 4E:
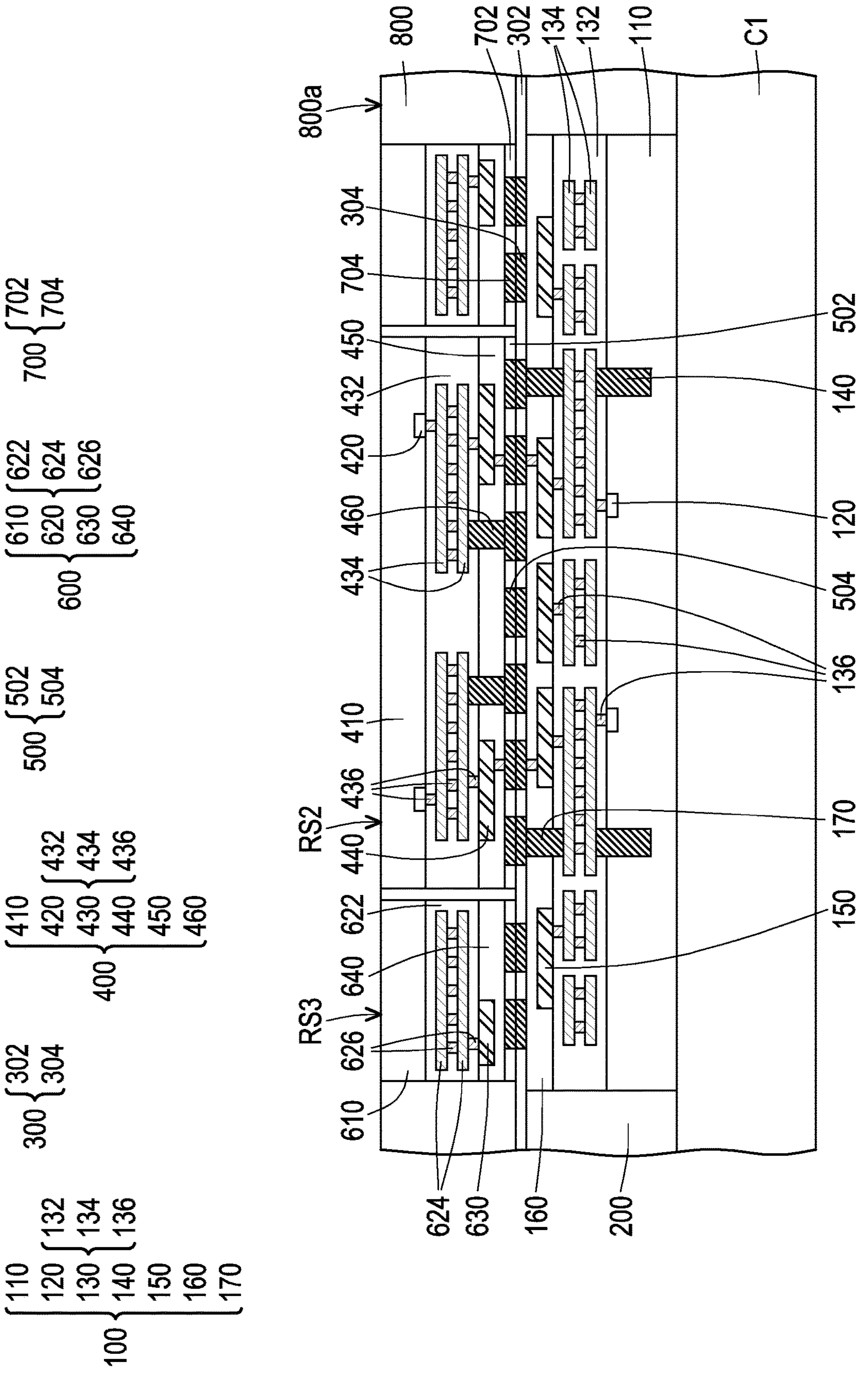
Figure 4F:
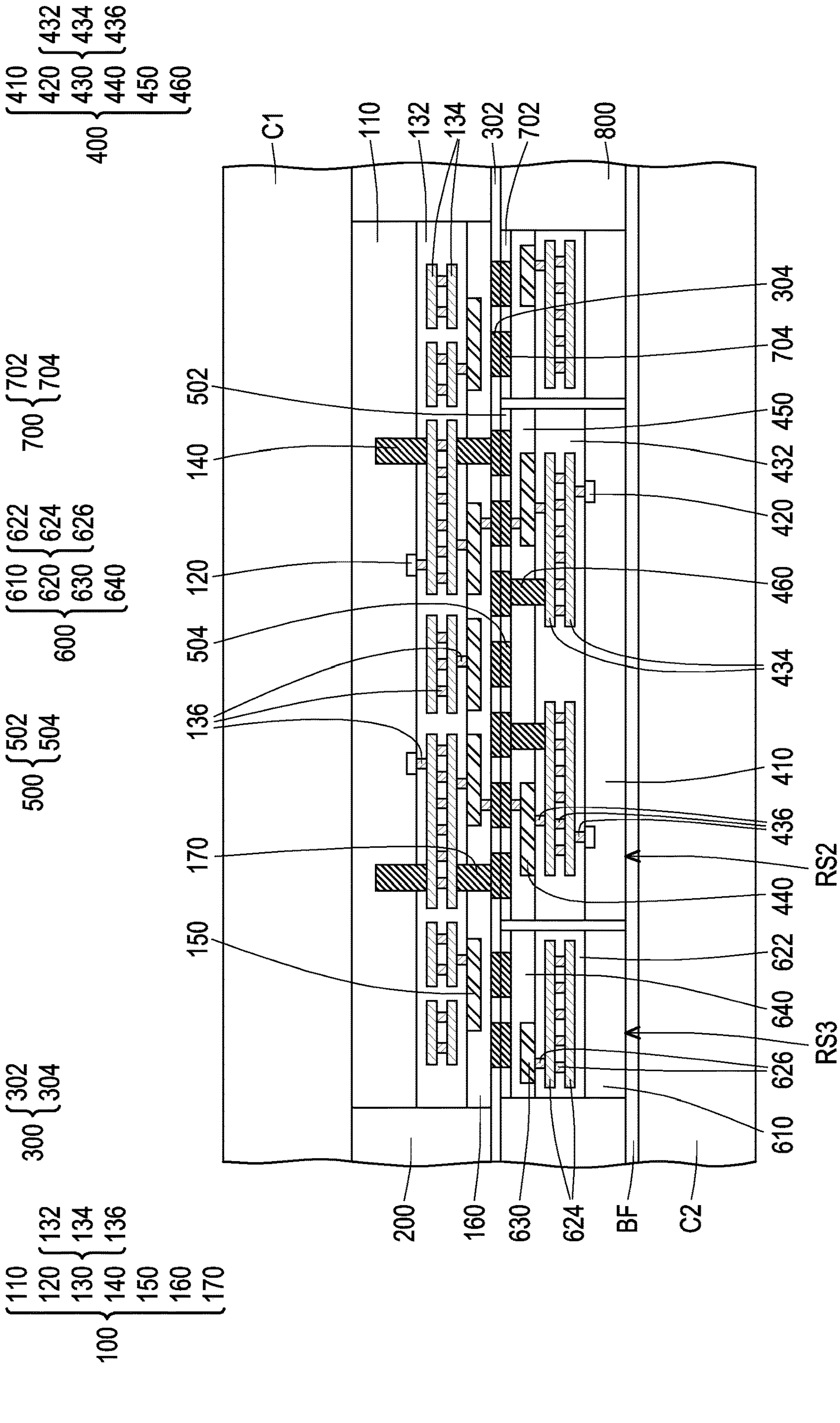
Figure 4G:
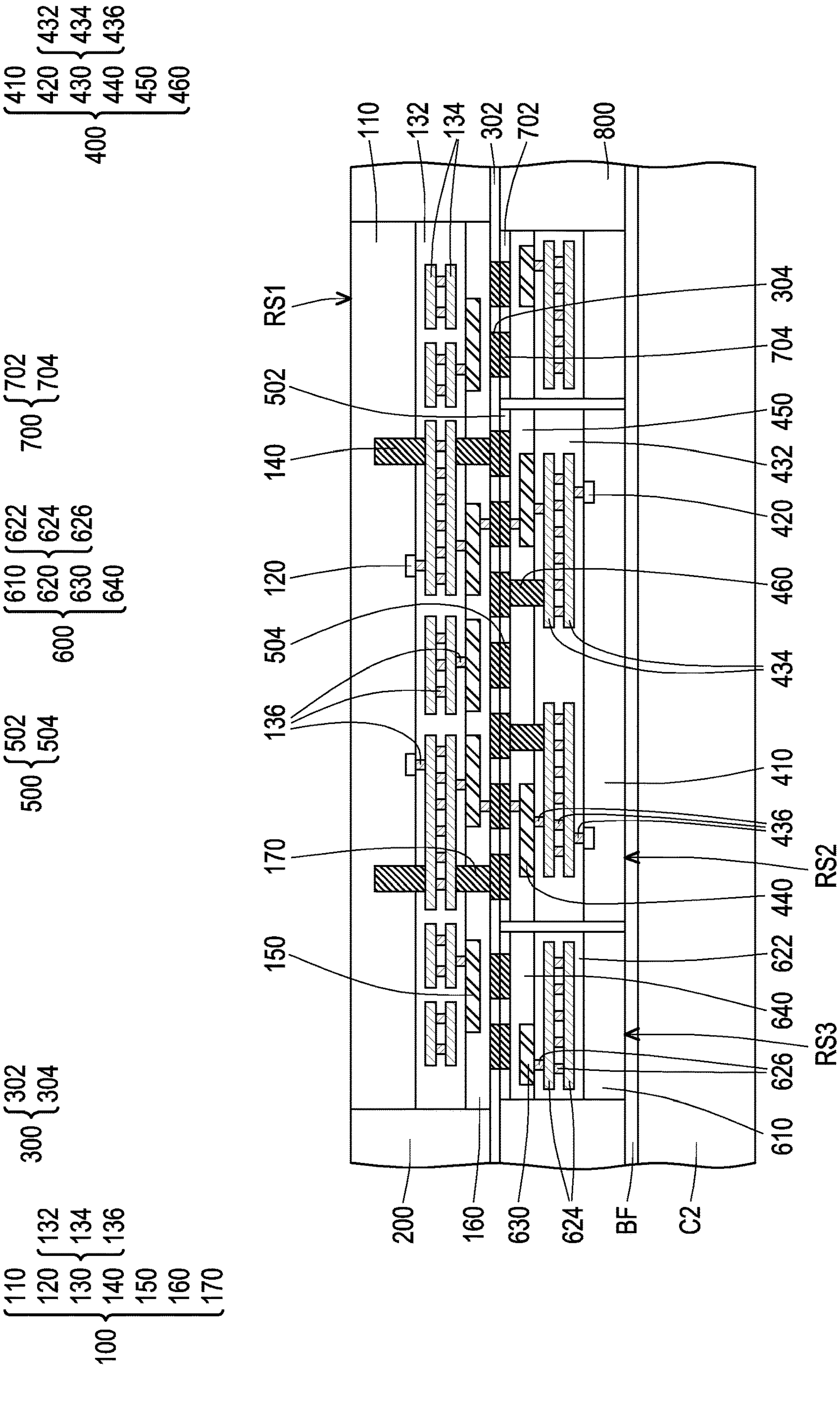
Figure 4H:
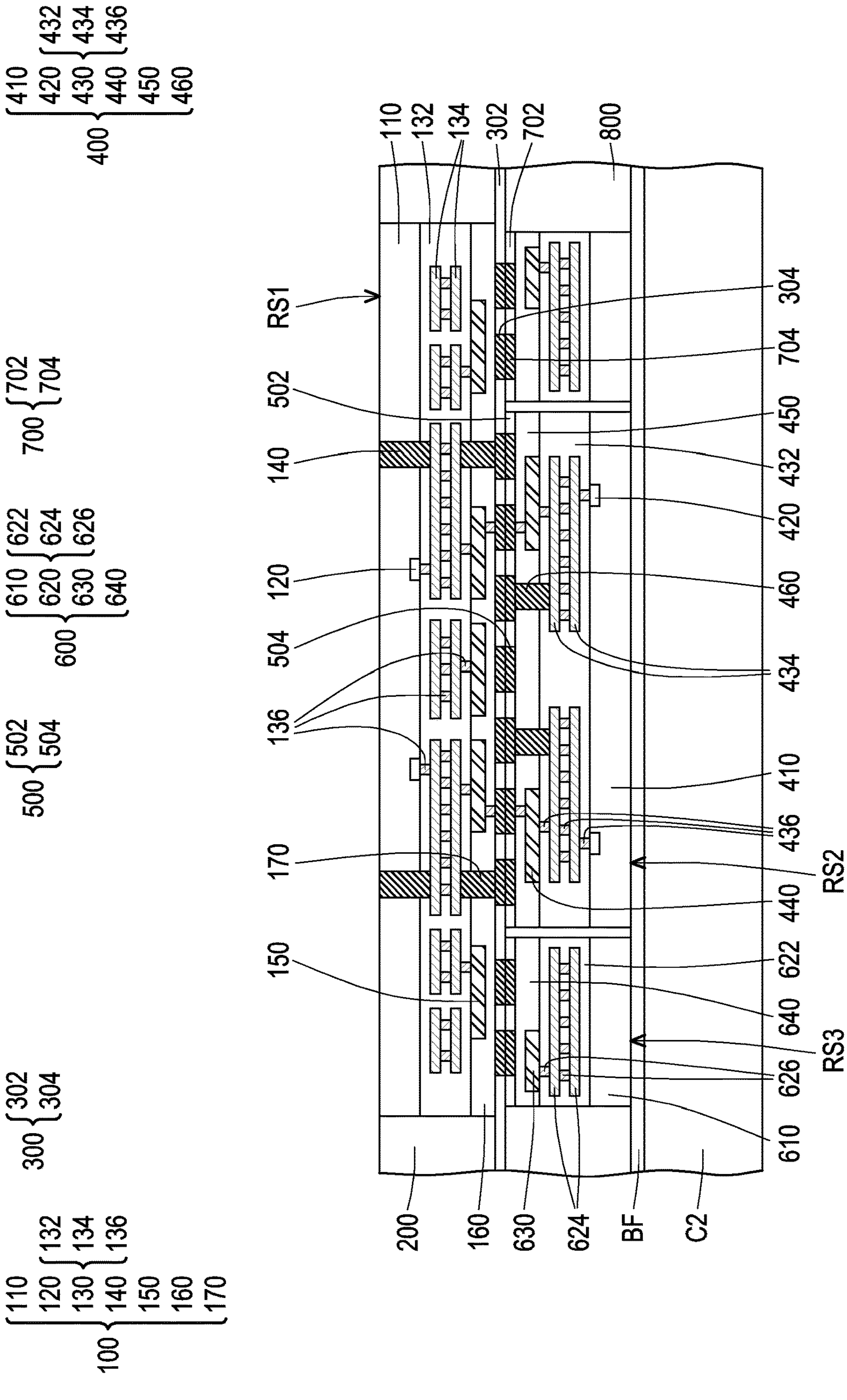
Figure 4I:
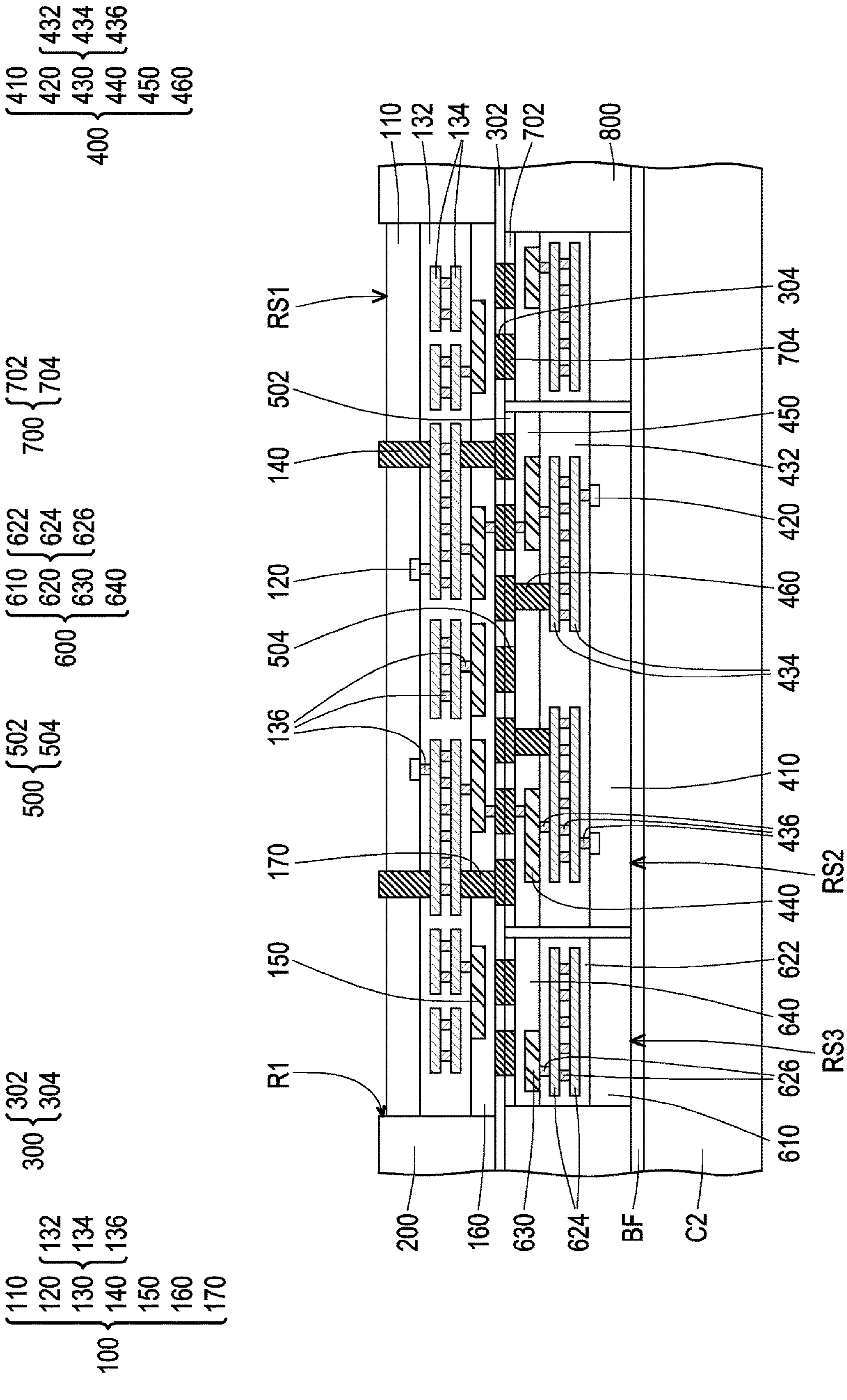
Figure 4J:
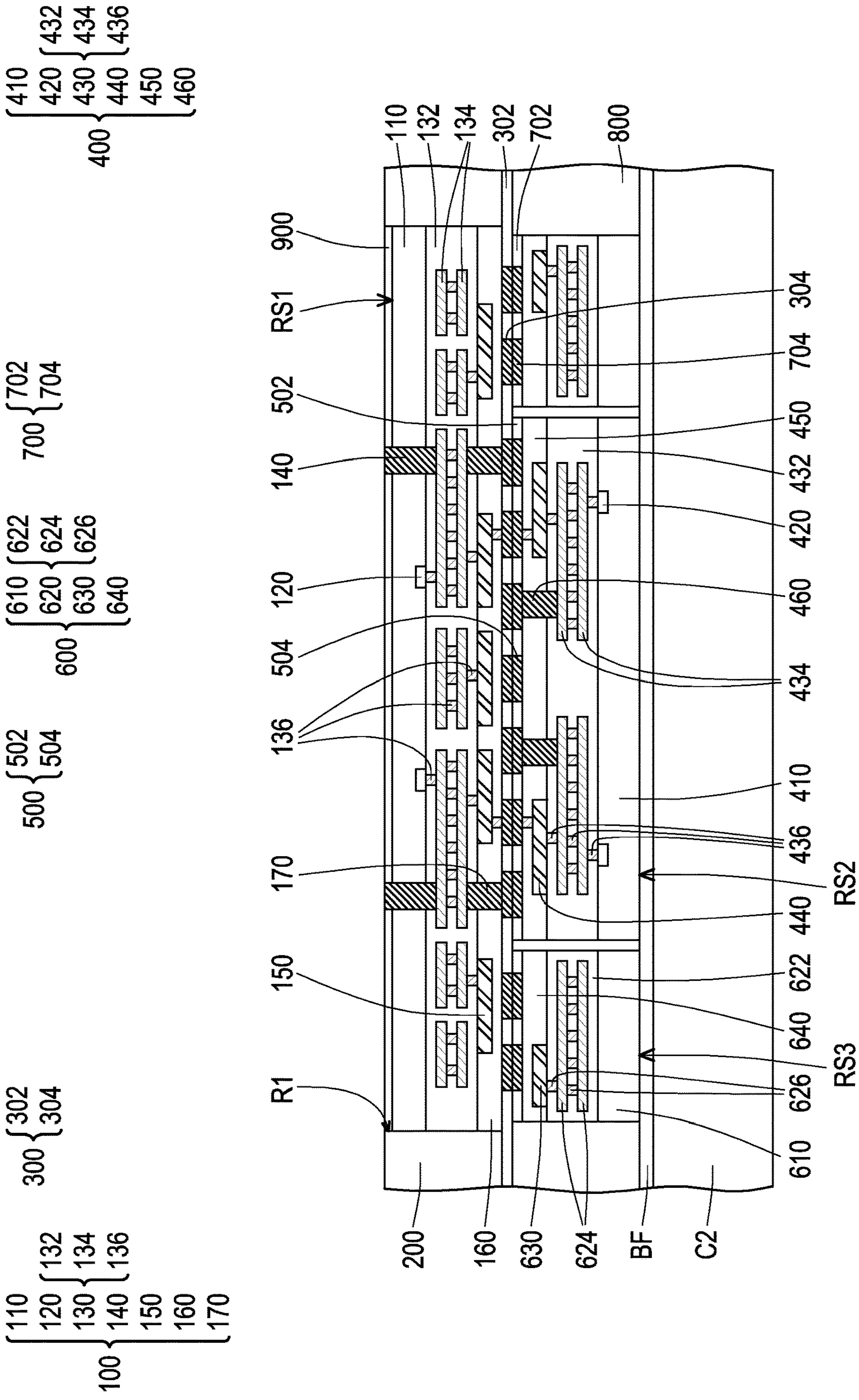
Figure 4K:
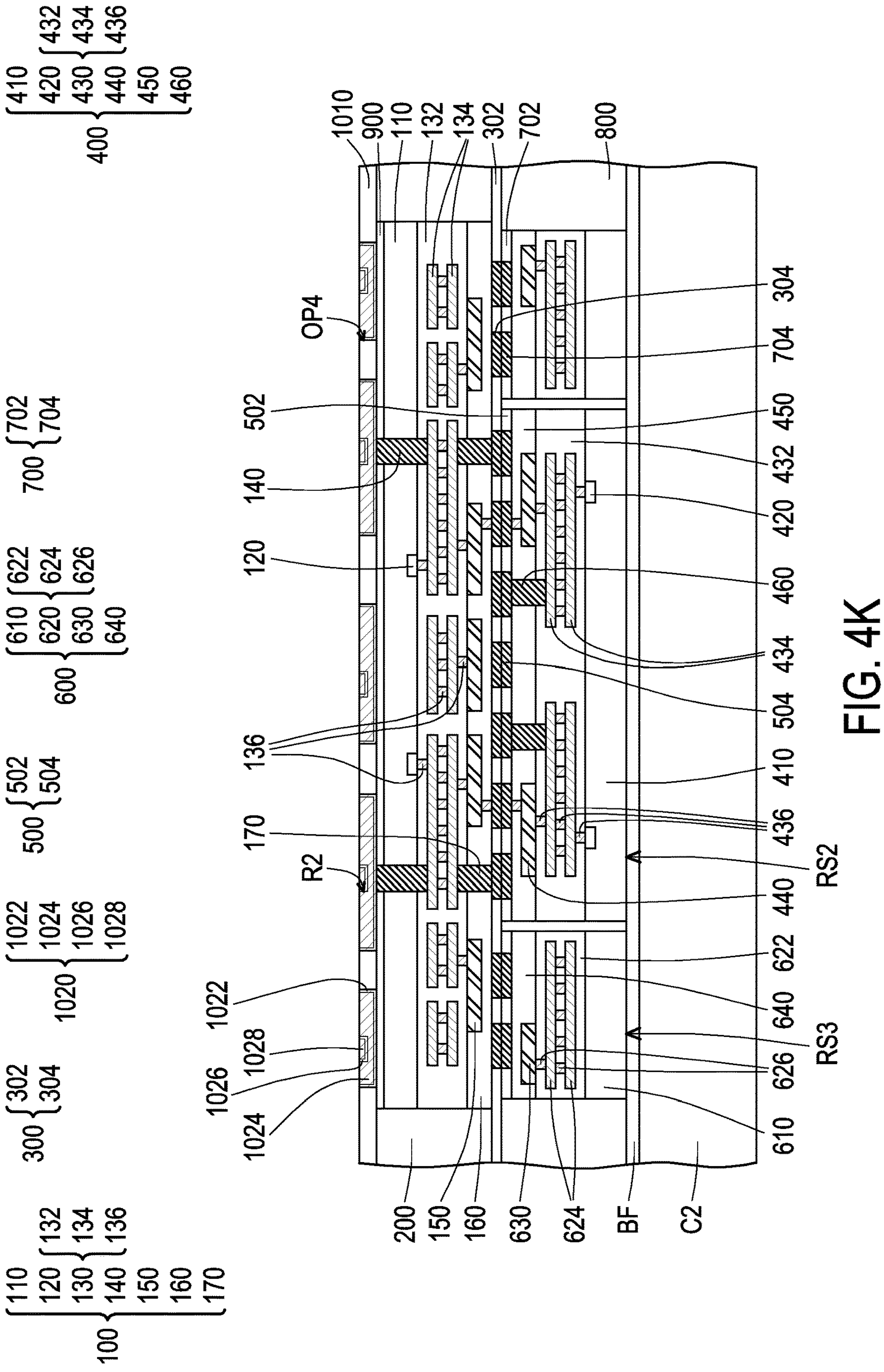
Figure 4L:
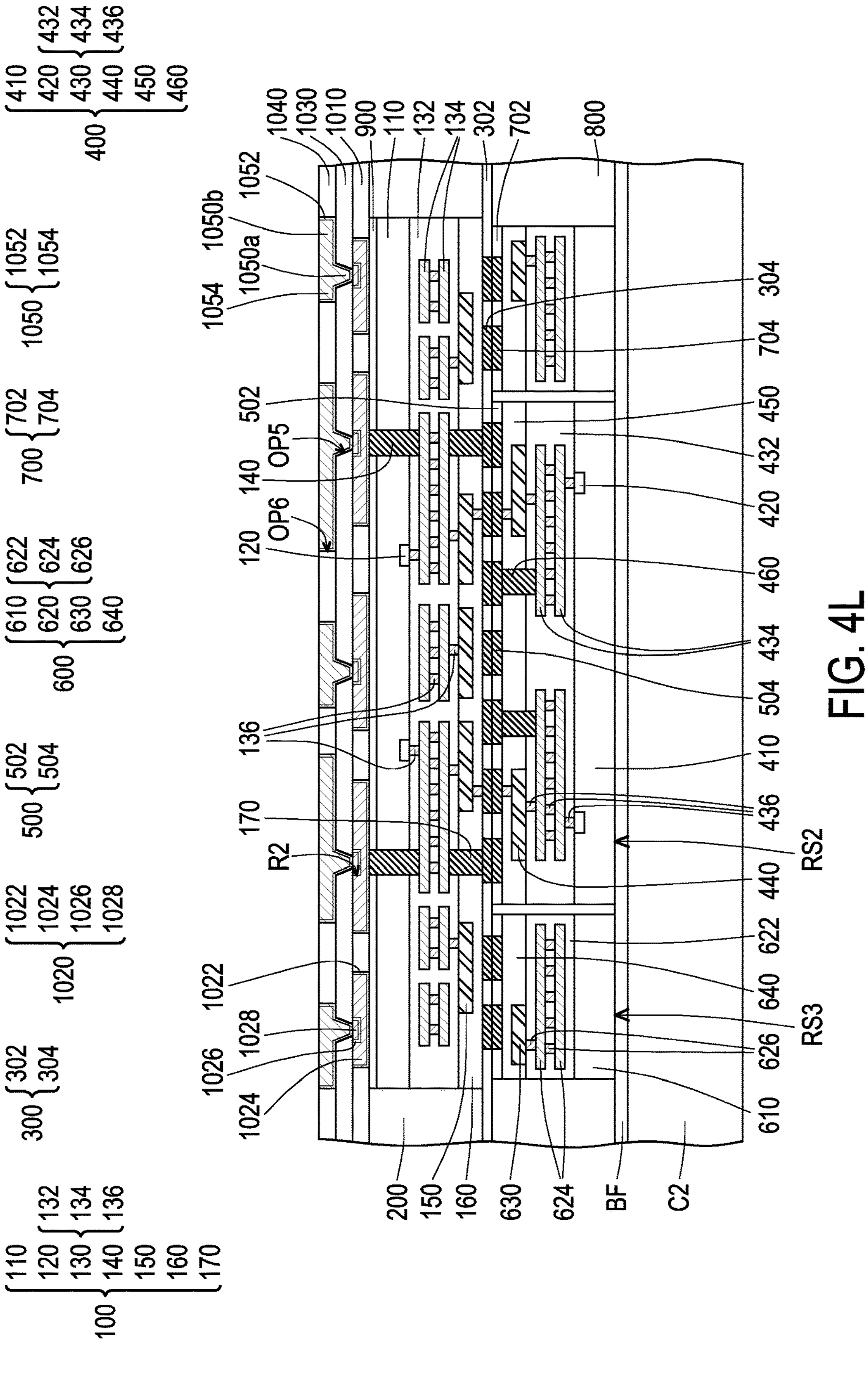
Figure 4M:
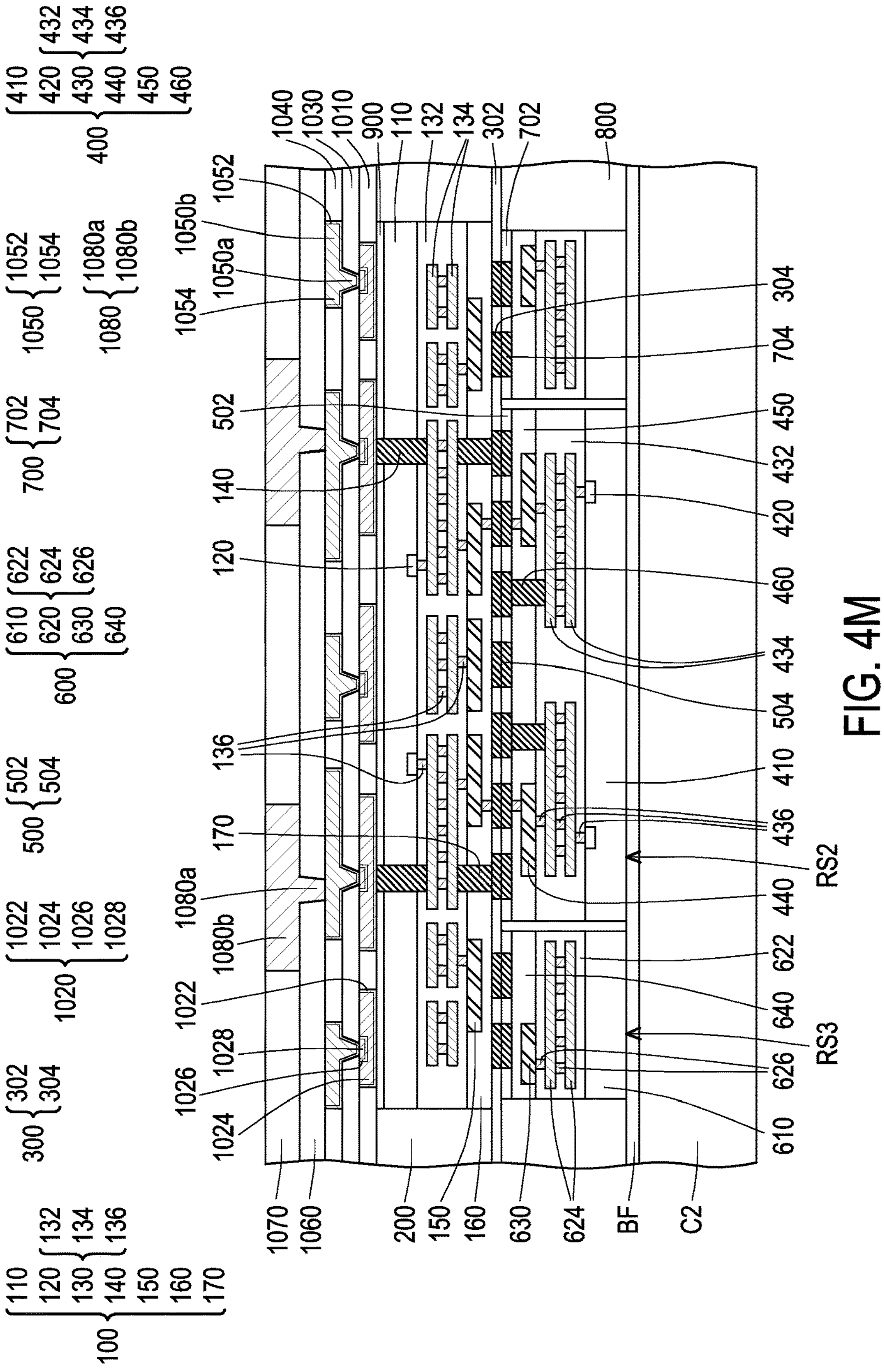
Figure 4N:
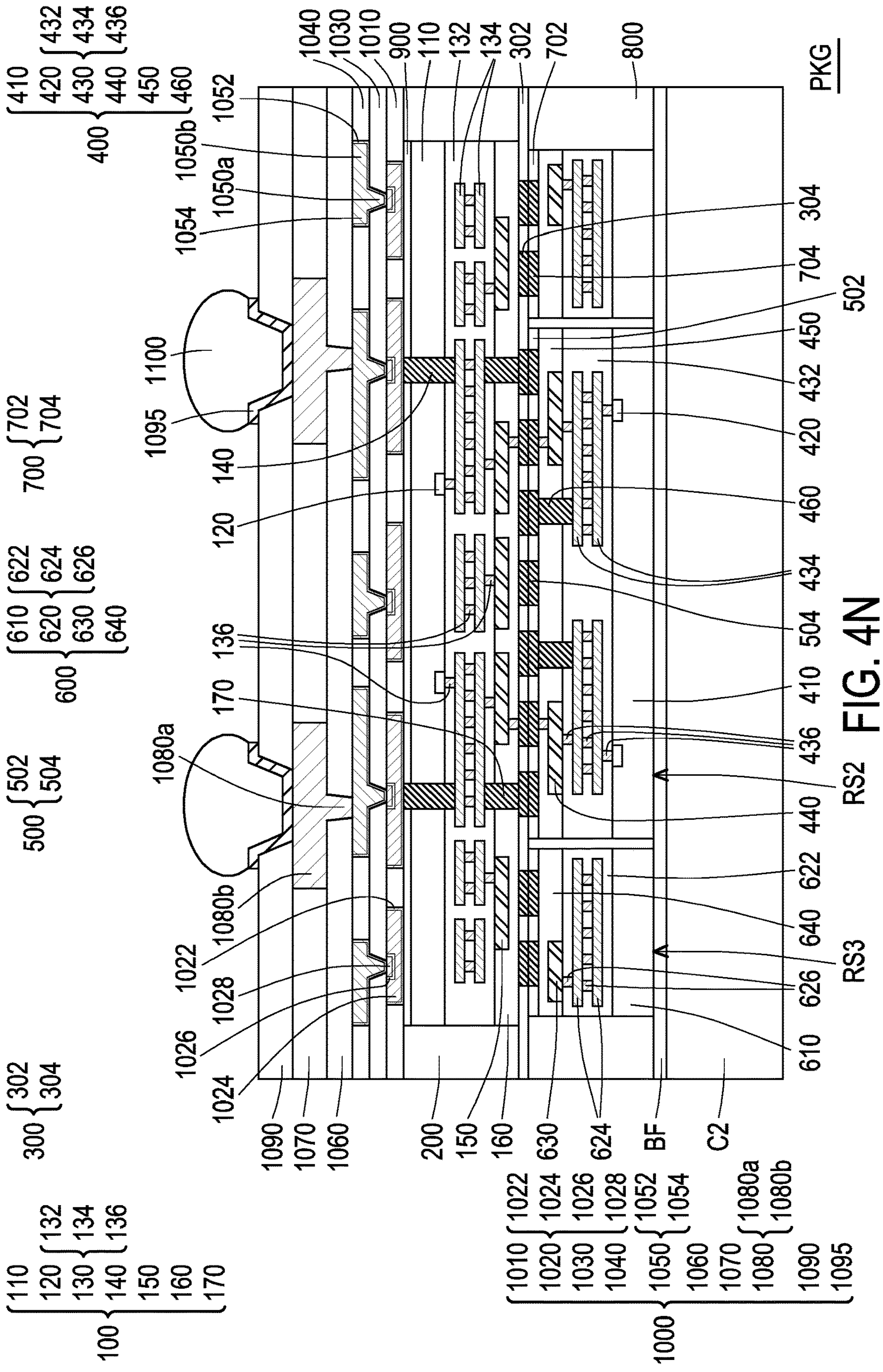

FIG. 4A to FIG. 4N are schematic cross-sectional views illustrating a manufacturing process of a package PKG in accordance with some embodiments of the disclosure. Referring to FIG. 4A, a carrier C1 is provided. In some embodiments, the carrier C1 is made of silicon, polymer, polymer composite, metal foil, ceramic, glass, glass epoxy, tape, or other suitable material for structural support. In some embodiments, the carrier C1 is free of active components and passive components. In some embodiments, the carrier C1 is also free of wire routings. For example, the carrier C1 may be a blank substrate which purely functions as a supporting element without serving any signal transmission function.

As illustrated in FIG. 4A, a first die 100 is placed on the carrier C1. In some embodiments, the first die 100 includes a semiconductor substrate 110, a plurality of devices 120, an interconnection structure 130, a plurality of through semiconductor vias (TSV) 140, a plurality of conductive pads 150, and a passivation layer 160. The semiconductor substrate 110 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The semiconductor substrate 110 may be a bulk silicon substrate, a silicon-on-insulator (SOI) substrate, or a germanium-on-insulator (GOI) substrate. In some embodiments, the devices 120 are formed in the semiconductor substrate 110. The devices 120 may include active components (e.g., transistors or the like) and/or passive components (e.g., resistors, capacitors, inductors, or the like).

As illustrated in FIG. 4A, an interconnection structure 130 is formed on the semiconductor substrate 110. In some embodiments, the interconnection structure 130 includes a dielectric layer 132, a plurality of conductive patterns 134, and a plurality of conductive vias 136. For simplicity, the dielectric layer 132 is illustrated as a single dielectric layer and the conductive patterns 134 are illustrated as embedded in the dielectric layer 132. Nevertheless, from the perspective of the manufacturing process, the dielectric layer 132 is constituted by at least two dielectric layers, and the conductive patterns 134 are sandwiched between two adjacent dielectric layers. In some embodiments, the conductive patterns 134 located at different level heights are connected to each other through the conductive vias 136. In other words, the conductive patterns 134 are electrically connected to each other through the conductive vias 136. In some embodiments, the bottommost conductive vias 136 are connected to the devices 120 embedded in the semiconductor substrate 110. In other words, the bottommost conductive vias 136 establish electrical connection between the devices 120 and the conductive patterns 134 of the interconnection structure 130. In some embodiments, the bottommost conductive vias 136 may be referred to as "contact structures" of the devices 120.

In some embodiments, a material of the dielectric layer 132 includes polyimide, epoxy resin, acrylic resin, phenol resin, BCB, PBO, or any other suitable polymer-based dielectric material. The dielectric layer 132, for example, may be formed by suitable fabrication techniques such as spin-on coating, CVD, PECVD, or the like. In some embodiments, materials of the conductive patterns 134 and the conductive vias 136 include aluminum, titanium, copper, nickel, tungsten, or alloys thereof. The conductive patterns 134 and the conductive vias 136 may be formed by, for example, electroplating, deposition, and/or photolithography and etching. In some embodiments, the conductive patterns 134 and the underlying conductive vias 136 are formed simultaneously. It should be noted that the number of the dielectric layers 132, the number of the conductive patterns 134, and the number of the conductive vias 136 illustrated in FIG. 4A are merely for illustrative purposes, and the disclosure is not limited thereto. In some alternative embodiments, fewer or more layers of the dielectric layers 132, the conductive patterns 134, or the conductive vias 136 may be formed depending on the circuit design.

In some embodiments, the TSVs 140 are embedded in the semiconductor substrate 110 and the dielectric layer 132 of the interconnection structure 130. That is, the TSVs 140 extend from the semiconductor substrate 110 to the interconnection structure 130. For example, a portion of each TSV 140 is embedded in the semiconductor substrate 110 while another portion of the same TSV 140 is embedded in the dielectric layer 132 of the interconnection structure 130. In some embodiments, the TSVs 140 are directly in contact with the conductive pattern 134 to render electrical connection with the interconnection structure 130.

As illustrated in FIG. 4A, the conductive pads 150 are formed over the interconnection structure 130. In some embodiments, the conductive pads 150 are electrically connected to the conductive patterns 134 of the interconnection structure 130 through the topmost conductive vias 136. In some embodiments, the conductive pads 150 are used to establish electrical connection with other components (not shown) or dies (not shown) subsequently formed or provided. In some alternative embodiments, the conductive pads 150 may be test pads. In some embodiments, the conductive pads 150 are aluminum pads, copper pads, or other suitable metal pads.

In some embodiments, the passivation layer 160 is formed over the interconnection structure 130 and the conductive pads 150. In some embodiments, a material of the passivation layer 160 includes oxides, such as silicon oxide or the like. Alternatively, the passivation layer 160 may include polyimide, epoxy resin, acrylic resin, phenol resin, BCB, PBO, or any other suitable polymer-based dielectric material. The passivation layer 160 may be formed by suitable fabrication techniques, such as spin-on coating, CVD, PECVD, or the like.

Referring to FIG. 4B, a first encapsulant 200 is formed on the carrier C1 to laterally encapsulate the first die 100. In some embodiments, a material of the first encapsulant 200 includes a molding compound, a polymeric material, such as polyimide, epoxy resin, acrylic resin, phenol resin, BCB, PBO, a combination thereof, or other suitable polymer-based dielectric materials. In some alternative embodiments, the first encapsulant 200 may include silicon oxide and/or silicon nitride. In some embodiments, the first encapsulant 200 further includes fillers. Alternatively, the first encapsulant 200 may be free of fillers. In some embodiments, the first encapsulant 200 is formed by a molding process (such as a compression molding process), a spin-coating process, a CVD process, a PECVD process, an ALD process, or the like. As illustrated in FIG. 4B, a top surface of the passivation layer 160 is substantially coplanar with a top surface of the first encapsulant 200. In some embodiments, the first encapsulant 200 may be referred to as "gap fill oxide."

Referring to FIG. 4C, a plurality of bonding vias 170 is formed to penetrate through the passivation layer 160 and at least part of the dielectric layer 132 of the interconnection structure 130 to establish electrical connection with the conductive patterns 134 of the interconnection structures 130. In some embodiments, the bonding vias 170 may be considered as part of the first die 100. As illustrated in FIG. 4C, the first die 100 has an active surface AS1 and a rear surface RS1 opposite to the active surface AS1.

In some embodiments, the first die 100 may be capable of performing storage functions. For example, the first die 100 may be Dynamic Random Access Memory (DRAM), Resistive Random Access Memory (RRAM), Static Random Access Memory (SRAM), or the like. However, the disclosure is not limited thereto. In some alternative embodiments, the first die 100 may be a Central Process Unit (CPU) die, a Graphic Process Unit (GPU) die, Field-Programmable Gate Array (FPGA), or the like.

As illustrated in FIG. 4C, a bonding layer 300 is formed on the first die 100 and the first encapsulant 200. For example, the bonding layer 300 is formed on the active surface AS1 of the first die 100. In some embodiments, the bonding layer 300 includes a dielectric layer 302 and a plurality of bonding pads 304. In some embodiments, the bonding pads 304 are embedded in the dielectric layer 302. In some embodiments, the bonding pads 304 of the bonding layer 300 are electrically connected to the bonding vias 170 of the first die 100. That is, the bonding vias 170 electrically connect the interconnection structure 130 with the bonding pads 304. In some embodiments, the bonding pads 304 are also electrically connected to some of the conductive pads 150 through conductive vias therebetween. That is, in some embodiments, some of the conductive pads 150 are electrically floating while some of the conductive pads 150 are able to transmit signal to the bonding pads 304.

In some embodiments, the bonding vias 170 and the bonding pads 304 may be formed via a dual damascene process. For example, the dielectric layer 302 is first formed on the passivation layer 160. In some embodiments, a material of the dielectric layer 302 includes oxides, such as silicon oxide or the like. Alternatively, the dielectric layer 302 may include polyimide, epoxy resin, acrylic resin, phenol resin, BCB, PBO, or any other suitable polymer-based dielectric material. The dielectric layer 302, for example, may be formed by suitable fabrication techniques, such as spin-on coating, CVD, PECVD, or the like. Subsequently, trenches and via holes (not shown) are formed in the dielectric layer 302 and the passivation layer 160 by removing portions of theses layers. In some embodiments, a width of the trench is greater than a width of the via hole. Thereafter, a conductive material (not shown) is filled into the via holes to form the bonding vias 170. Meanwhile, the conductive material (not shown) also fills into the trenches to from the bonding pads 304. That is, the bonding vias 170 and the bonding pads 304 are formed by simultaneously filling the via holes and the overlying trenches (not shown). However, the disclosure is not limited thereto. In some alternative embodiments, the bonding vias 170 may be formed before the dielectric layer 302 and the bonding pads 304. In some embodiments, a width of each bonding pad 304 may be greater than a width of each underlying bonding via 170. In some embodiments, the bonding vias 170 and the bonding pads 304 include the same material. For example, the bonding vias 170 and the bonding pads 304 may be made of aluminum, titanium, copper, nickel, tungsten, or alloys thereof. In some embodiments, a top surface of the dielectric layer 302 and top surfaces of the bonding pads 304 are substantially located at the same level height to provide an appropriate top surface 300*a* for hybrid bonding.

Referring to FIG. 4D, a second die 400 and a plurality of dummy dies 600 are provided. In some embodiments, the second die 400 includes a semiconductor substrate 410, a plurality of devices 420, an interconnection structure 430, a plurality of conductive pads 440, a passivation layer 450, and a plurality of bonding vias 460. In some embodiments, the devices 420 are formed in the semiconductor substrate 410. The semiconductor substrate 410 and the devices 420 in the second die 400 are respectively similar to the semiconductor substrate 110 and the devices 120 in the first die 100, so the detailed descriptions thereof are omitted herein.

As illustrated in FIG. 4D, the interconnection structure 430 is disposed on the semiconductor substrate 410. In some embodiments, the interconnection structure 430 is electrically connected to the devices 420 formed in the semiconductor substrate 410. In some embodiments, the interconnection structure 430 includes a dielectric layer 432, a plurality of conductive patterns 434, and a plurality of conductive vias 436. The dielectric layer 432, the conductive patterns 434, and the conductive vias 436 of the interconnection structure 430 are respectively similar to the dielectric layer 132, the conductive patterns 134, and the conductive vias 136 of the interconnection structure 130, so the detailed descriptions thereof are omitted herein.

In some embodiments, the conductive pads 440, the passivation layer 450, and the bonding vias 460 are formed over the interconnection structure 430. In some embodiments, the conductive pads 440, the passivation layer 450, and the bonding vias 460 of the second die 400 are respectively similar to the conductive pads 150, the passivation layer 160, and the bonding vias 170 of the first die 100, so the detailed descriptions thereof are omitted herein. In some embodiments, the conductive pads 440 are electrically connected to the interconnection structure 430. In some embodiments, the bonding vias 460 are formed to penetrate through the passivation layer 450 and at least part of the dielectric layer 432 of the interconnection structure 430 to establish electrical connection with the conductive patterns 434 of the interconnection structures 430. That is, a portion of each bonding via 460 is embedded in the passivation layer 450 while another portion of the same bonding via 460 is embedded in the dielectric layer 432 of the interconnection structure 430.

As illustrated in FIG. 4D, the second die 400 has an active surface AS2 and a rear surface RS2 opposite to the active surface AS2. In some embodiments, the second die 400 may be capable of performing storage functions. For example, the second die 400 may be DRAM, RRAM, SRAM, or the like. However, the disclosure is not limited thereto. In some alternative embodiments, the second die 400 may be a CPU die, a GPU die, FPGA, or the like.

As illustrated in FIG. 4D, a bonding layer 500 is formed on the second die 400. For example, the bonding layer 500 is formed on the active surface AS2 of the second die 400. In some embodiments, the bonding layer 500 includes a dielectric layer 502 and a plurality of bonding pads 504. The dielectric layer 502 and the bonding pads 504 of the bonding layer 500 are respectively similar to the dielectric layer 302 and the bonding pads 304 of the bonding layer 300, so the detailed descriptions thereof are omitted herein. In some embodiments, the bonding pads 504 are electrically connected to the bonding vias 460. That is, the bonding via 460 electrically connects the interconnection structure 430 with the bonding pads 504. In some embodiments, the bonding pads 504 are also electrically connected to the conductive pads 440. In some embodiments, a bottom surface of the dielectric layer 502 and bottom surfaces of the bonding pads 504 are substantially located at the same level height to provide an appropriate bottom surface 500*a* for hybrid bonding.

In some embodiments, each dummy die 600 includes a semiconductor substrate 610, an interconnection structure 620, a conductive pad 630, and a passivation layer 640. The semiconductor substrate 610 of the dummy dies 600 is similar to the semiconductor substrate 110 of the first die 100, so the detailed description thereof is omitted herein.

As illustrated in FIG. 4D, the interconnection structure 620 is disposed on the semiconductor substrate 610. In some embodiments, the interconnection structure 620 includes a dielectric layer 622, a plurality of conductive patterns 624, and a plurality of conductive vias 626. The dielectric layer 622, the conductive patterns 624, and the conductive vias 626 of the interconnection structure 620 are respectively similar to the dielectric layer 132, the conductive patterns 134, and the conductive vias 136 of the interconnection structure 130, so the detailed descriptions thereof are omitted herein.

In some embodiments, the conductive pad 630 and the passivation layer 640 are formed over the interconnection structure 620. In some embodiments, the conductive pad 630 and the passivation layer 640 of the dummy dies 600 are respectively similar to the conductive pads 150 and the passivation layer 160 of the first die 100, so the detailed descriptions thereof are omitted herein. In some embodiments, the conductive pad 630 is electrically connected to the interconnection structure 620 through a conductive via therebetween.

As illustrated in FIG. 4D, each dummy die 600 has an active surface AS3 and a rear surface RS3 opposite to the active surface AS3. In some embodiments, each dummy die 600 is free of active component and passive component. For example, the dummy dies 600 may not contribute to the operation of the subsequently formed package PKG.

As illustrated in FIG. 4D, a bonding layer 700 is formed on each dummy die 600. For example, the bonding layer 700 is formed on the active surface AS3 of the dummy die 600. In some embodiments, the bonding layer 700 includes a dielectric layer 702 and a plurality of bonding pads 704. The dielectric layer 702 and the bonding pads 704 of the bonding layer 700 are respectively similar to the dielectric layer 302 and the bonding pads 304 of the bonding layer 300, so the detailed descriptions thereof are omitted herein. In some embodiments, the bonding pads 704 are electrically isolated from the dummy dies 600. That is, the bonding pads 704 are dummy bonding pads. In some embodiments, a bottom surface of the dielectric layer 702 and bottom surfaces of the bonding pads 704 are substantially located at the same level height to provide an appropriate bottom surface 700*a* for hybrid bonding.

In some embodiments, the second die 400 and the dummy dies 600 are placed on the bonding layer 300 such that the second die 400 and the dummy dies 600 are bonded to the first die 100. In some embodiments, the second die 400 and the dummy dies 600 may be bonded to the first die 100 through a hybrid bonding process. The hybrid bonding process will be described in detail below.

First, the second die 400 and the dummy dies 600 having the boding layers 500 and 700 respectively formed thereon may be picked-and-placed onto the bonding layer 300 such that the second die 400 and the dummy dies 600 are electrically connected to the first die 100. In some embodiments, the dummy dies 600 are disposed adjacent to the second die 400. In some embodiments, the second die 400 and the dummy dies 600 are placed such that the bottom surface 500*a* of the bonding layer 500 and the bottom surfaces 700*a* of the bonding layer 700 are in contact with the top surface 300*a* of the bonding layer 300. Meanwhile, the bonding pads 504 of the bonding layer 500 and the bonding pads 704 of the bonding layer 700 are substantially aligned and in direct contact with the corresponding bonding pads 304 of the bonding layer 300. In some embodiments, to facilitate the hybrid bonding between the first die 100, the second die 200, and the dummy dies 600, surface preparation for bonding surfaces (i.e. the top surfaces 300*a*, the bottom surface 500*a*, and the bottom surface 700*a*) of the bonding layers 300, 500, and 700 may be performed. The surface preparation may include surface cleaning and activation, for example. Surface cleaning may be performed on the top surfaces 300*a*, the bottom surface 500*a*, and the bottom surface 700*a* to remove particles on the bonding surface of the dielectric layer 302, the bonding surfaces of the bonding pads 304, the bonding surface of the dielectric layer 502, the bonding surfaces of the bonding pads 504, the bonding surface of the dielectric layer 702, and the bonding surfaces of the bonding pads 704. In some embodiments, the top surfaces 300*a*, the bottom surface 500*a*, and the bottom surface 700*a* may be cleaned by wet cleaning, for example. Not only particles are removed, but also native oxide formed on the bonding surfaces of the bonding pads 304, the bonding pads 504, and the bonding pads 704 may be removed. The native oxide formed on the bonding surfaces of the bonding pads 304, the bonding pads 504, and the bonding pads 704 may be removed by chemicals used in wet cleaning processes, for example.

After cleaning the top surfaces 300*a*, the bottom surface 500*a*, and the bottom surface 700*a*, activation of the bonding surfaces of the dielectric layer 302, the dielectric layer 502, and the dielectric layer 702 may be performed for development of high bonding strength. In some embodiments, plasma activation may be performed to treat the bonding surfaces of the dielectric layer 302, the dielectric layer 502, and the dielectric layer 702. When the activated bonding surface of the dielectric layers 502 and 702 are in contact with the activated bonding surface of the dielectric layer 302, the dielectric layer 302 of the bonding layer 300, the dielectric layer 502 of the bonding layer 500, and the dielectric layer 702 of the bonding layer 700 are pre-bonded. In other words, the second die 400 and the dummy dies 600 are pre-bonded to the first die 100.

After pre-bonding the second die 400 and the dummy dies 600 onto the first die 100, hybrid bonding of the second die 400, the dummy dies 600, and the first die 100 is performed. The hybrid bonding of the second die 400, the dummy dies 600, and the first die 100 may include a thermal treatment for dielectric bonding and a thermal annealing for conductor bonding. In some embodiments, the thermal treatment for dielectric bonding is performed to strengthen the bonding between the dielectric layers 502, 702 and the dielectric layer 302. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the bonding pads 504, 704 and the bonding pads 304. For example, the thermal annealing for conductor bonding may be performed at temperature ranging from about 150° C. to about 400° C. After performing the thermal annealing for conductor bonding, the dielectric layers 502, 702 are hybrid bonded to the dielectric layer 302 and the bonding pads 504, 704 are hybrid bonded to the bonding pads 304. For example, the dielectric layers 502, 702 are directly in contact with the dielectric layer 302. Similarly, the bonding pads 504, 704 are directly in contact with the bonding pads 304. As such, the bonding layer 500 and the bonding layer 700 are hybrid bonded to the bonding layer 300. In other words, the second die 400 and the dummy dies 600 are hybrid bonded to the first die 100. Although FIG. 4D illustrated that the bonding pads 304, the bonding pads 504, and the bonding pads 704 have sharp corners (the sidewalls are perpendicular to the top/bottom surfaces), the disclosure is not limited thereto. In some alternative embodiments, after the bonding pads 504, 704 are hybrid bonded to the bonding pads 304, corner rounding of the bonding pads may occur. For example, the corners of the bonding pads 304 facing the bonding pads 504, 704 are rounded. Similarly, the corners of the bonding pads 504, 704 facing the bonding pads 304 are also rounded. That is, edges of the top surface of each bonding pad 304 are rounded. Similarly, edges of the bottom surface of each bonding pad 504 and each bonding pad 704 are also rounded. Moreover, although FIG. 4D illustrated that the bonding pads 304 and the bonding pads 504, 704 have the same width and sidewalls of the bonding pads 304 are aligned with sidewalls of the corresponding bonding pads 504, 704, the disclosure is not limited thereto. In some alternative embodiments, the width of each bonding pad 304 may be smaller than or larger than the width of each bonding pad 504 and each bonding pad 704.

In some embodiments, since the first die 100 is encapsulated in the first encapsulant 200 to constitute wafer form and the second die 400 and the dummy dies 600 are in chip form, the hybrid bonding process in FIG. 4D may be referred to as a "chip-on-wafer bonding process." In some embodiments, since the active surface AS1 of the first die 100 faces the active surface AS2 of the second die 400 and the active surfaces AS3 of the dummy dies 600, the bonding of the first die 100 with the second die 400 and the dummy dies 600 may be considered as face-to-face bonding.

Referring to FIG. 4E, a second encapsulant 800 is formed on the bonding layer 300 to laterally encapsulate the second die 400 and the dummy dies 600. In some embodiments, a formation method and a material of the second encapsulant 800 are respectively similar to that of the first encapsulant 200, so the detailed descriptions thereof are omitted herein. As illustrated in FIG. 4E, the rear surface RS2 of the second die 400 and the rear surfaces RS3 of the dummy dies 600 are substantially coplanar with a top surface 800*a* of the second encapsulant 800. In some embodiments, the second encapsulant 800 may be referred to as "gap fill oxide."

Referring to FIG. 4E and FIG. 4F, the structure illustrated in FIG. 4E is flipped upside down and is attached to a carrier C2 through a bonding film BF. In some embodiments, the carrier C2 is made of silicon, polymer, polymer composite, metal foil, ceramic, glass, glass epoxy, tape, or other suitable material for structural support. In some embodiments, the structure illustrated in FIG. 4E may be bonded to the carrier C2 and the bonding film BF through fusion bonding.

Referring to FIG. 4F and FIG. 4G, the carrier C1 is removed. In some embodiments, the carrier C1 is removed through an etching process, a grinding process, a de-bonding process, or the like. For example, the carrier C1 may be removed through a CMP process. After the carrier C1 is removed, the first die 100 and the first encapsulant 200 are exposed. For example, the rear surface RS1 of the first die 100 is exposed.

Referring to FIG. 4G and FIG. 4H, a portion of the first die 100 and a portion of the first encapsulant 200 are removed. For example, the first die 100 and the first encapsulant 200 are thinned until the TSVs 140 are exposed. That is, the first die 100 is thinned from the rear surface RS1. In some embodiments, the first die 100 and the first encapsulant 200 may be thinned or planarized through a grinding process, such as a mechanical grinding process, a CMP process, or the like. In some embodiments, after the TSVs 140 are exposed, the first die 100 and the first encapsulant 200 may be further thinned to reduce the overall thickness of the first die 100. As illustrated in FIG. 4H, after the thinning process, the TSVs 140 penetrate through the semiconductor substrate 110 of the first die 100.

Referring to FIG. 4H and FIG. 4I, a portion of the first die 100 is removed to form a recess R1. For example, a portion of the semiconductor substrate 110 of the first die 100 is removed to form the recess R1. As illustrated in FIG. 4I, each TSV 140 is partially located in the recess R1. In some embodiments, at least a portion of each TSV 140 protrudes out from the semiconductor substrate 110 of the first die 100. That is, a top surface of each TSV 140 and the top surface of the first encapsulant 200 are located at a level height higher than the rear surface RS1 of the first die 100. In some embodiments, the semiconductor substrate 110 may be partially removed through an etching process. The etching process includes, for example, an isotropic etching process and/or an anisotropic etching process. For example, the semiconductor substrate 110 may be partially removed through a wet etching process, a drying etching process, or a combination thereof.

Referring to FIG. 4J, a protection layer 900 is formed to fill the recess R1. In some embodiments, the protection layer 900 includes a molding compound, a molding underfill, or the like. Alternatively, the protection layer 900 may be made of a polymeric material, such as polyimide, epoxy resin, acrylic resin, phenol resin, BCB, PBO, or other suitable polymer-based dielectric materials. In some embodiments, the protection layer 900 may include fillers. Alternatively, the protection layer 900 may be free of fillers. As illustrated in FIG. 4J, the protruding portion of each TSV 140 is laterally encapsulated by the protection layer 900. In some embodiments, the protection layer 900 may be formed by the following steps. First, a protection material layer (not shown) is formed in the recess R1 and over the first encapsulant 200. Subsequently, a grinding or thinning process is performed on the protection material layer until the TSVs 140 are revealed. The thinning process includes, for example, a mechanical grinding process, a CMP process, or the like. As illustrated in FIG. 4J, the first encapsulant 200 laterally encapsulates the protection layer 900.

Referring to FIG. 4K to FIG. 4N, a redistribution structure 1000 is formed on the first die 100 and the first encapsulant 200. In some embodiments, the patterns forming method illustrated in FIG. 1A to FIG. 1N may be adopted to form the redistribution structure 1000. The process of forming the redistribution structure 1000 will be described in detail below.

Referring to FIG. 4K, a dielectric layer 1010 is formed on the first die 100, the first encapsulant 200, and the protection layer 900. For example, the first dielectric layer 1010 is in physical contact with the TSVs 140 of the first die 100, the first encapsulant 200, and the protection layer 900. In some embodiments, the dielectric layer 1010 has a plurality of openings OP4. In some embodiments, some of the openings OP4 expose the TSVs 140 of the first die 100. In some embodiments, the dielectric layer 1010 in FIG. 4K is similar to the first dielectric layer 10 in FIG. 1A and FIG. 1B, so the detailed description thereof is omitted herein.

As illustrated in FIG. 4K, a plurality of conductive patterns 1020 is formed to fill up the openings OP4 of the dielectric layer 1000. In other words, the conductive patterns 1020 are embedded in the dielectric layer 1000. In some embodiments, some of the conductive patterns 1020 are in physical contact with the TSVs 140 of the first die 100. In some embodiments, the conductive patterns 1020 in FIG. 4K are similar to the first conductive pattern 20 in FIG. 1H, so each of the conductive patterns 1020 in FIG. 4K may be formed by the process illustrated in FIG. 1C to FIG. 1H. The step of forming the conductive patterns 1020 will be briefly described below.

First, a seed layer 1022 and a conductive layer 1024 are formed to fill up the openings OP4. In some embodiments, the seed layer 1022 and the conductive layer 1024 in FIG. 4K are respectively similar to the first seed layer 22 and the first conductive layer 24 in FIG. 1D, so the detailed descriptions thereof are omitted herein. In some embodiments, the seed layer 1022 and the conductive layer 1024 are embedded in the dielectric layer 1010. As illustrated in FIG. 4K, the seed layer 1022 surrounds the conductive layer 1024. For example, the seed layer 1022 exhibits a U-shape in the cross-sectional view of FIG. 4K to surround the conductive layer 1024. That is, the seed layer 1022 covers sidewalls and a bottom surface of the conductive layer 1024.

Thereafter, a portion of each conductive layer 1024 is removed to form a recess R2. Then, a vacancy migration blocking layer 1026 and a conductive layer 1028 are formed to fill up the recess R2. In some embodiments, the vacancy migration blocking layer 1026 and the conductive layer 1028 in FIG. 4K are respectively similar to the vacancy migration blocking layer 26 and the second conductive layer 28 in FIG. 1H, so the detailed descriptions thereof are omitted herein. In some embodiments, the vacancy migration blocking layer 1026 surrounds the conductive layer 1028. For example, the vacancy migration blocking layer 1026 exhibits a U-shape in the cross-sectional view of FIG. 4K to surround the conductive layer 1028. That is, the vacancy migration blocking layer 1026 covers sidewalls and a bottom surface of the conductive layer 1028. As illustrated in FIG. 4K, the vacancy migration blocking layer 1026 and the conductive layer 1028 are embedded in the conductive layer 1024. For example, the vacancy migration blocking layer 1026 is spatially separated from the seed layer 1022. In some embodiments, the conductive layer 1024 is sandwiched between the seed layer 1022 and the vacancy migration blocking layer 1026. Meanwhile, the vacancy migration blocking layer 1026 is sandwiched between the conductive layer 1024 and the conductive layer 1028.

In some embodiments, a material of the seed layer 1022 is the same as a material of the vacancy migration blocking layer 1026. However, the disclosure is not limited thereto. In some alternative embodiments, the material of the seed layer 1022 is different from the material of the vacancy migration blocking layer 1026. For example, the seed layer 1022 is constituted by two sub-layers (not shown). The first sub-layer of the seed layer 1022 may include titanium, titanium nitride, tantalum, tantalum nitride, cobalt, manganese, other suitable materials, or a combination thereof. On the other hand, the second sub-layer of the seed layer 1022 may include copper, copper alloys, or other suitable choice of materials. Similarly, the vacancy migration blocking layer 1026 is also constituted by two sub-layers (not shown). The first sub-layer of the vacancy migration blocking layer 1026 may include titanium, titanium nitride, tantalum, tantalum nitride, cobalt, manganese, other suitable materials, or a combination thereof. On the other hand, the second sub-layer of the vacancy migration blocking layer 1026 may include copper, copper alloys, or other suitable choice of materials.

In some embodiments, a material of the conductive layer 1024 is the same as a material of the conductive layer 1028. However, the disclosure is not limited thereto. In some alternative embodiments, the material of the conductive layer 1024 is different from the material of the conductive layer 1028. For example, the conductive layer 1024 and the conductive layer 1028 are respectively made of aluminum, titanium, copper, tungsten, and/or alloys thereof. In certain embodiments, the material of the conductive layer 1024 and the material of the conductive layer 1028 include copper.

As illustrated in FIG. 4K, each conductive pattern 1020 includes the seed layer 1022, the conductive layer 1024, the vacancy migration blocking layer 1026, and the conductive layer 1028.

Referring to FIG. 4L, a dielectric layer 1030 and a dielectric layer 1040 are formed on the dielectric layer 1010 and the conductive patterns 1020. For example, the dielectric layer 1030 is in physical contact with the dielectric layer 1010 and the conductive patterns 1020. In some embodiments, the dielectric layer 1030 has a plurality of openings OP5 and the dielectric layer 1040 has a plurality of openings OP6. In some embodiments, the openings OP5 expose the conductive layer 1028 of each conductive pattern 1020. Meanwhile, the openings OP6 expose a portion of the dielectric layer 1030 and the openings OP5. In some embodiments, the dielectric layer 1030 and the dielectric layer 1040 in FIG. 4L are respectively similar to the second dielectric layer 30 and the third dielectric layer 40 in FIG. 1I, so the detailed description thereof is omitted herein.

In some embodiments, the openings OP5 and the openings OP6 are formed by the steps similar to the process illustrated in FIG. 1J to FIG. 1M and will be briefly described below.

First, a portion of the dielectric layer 1040 is removed to form openings OP6 in the dielectric layer 1040. For example, an etching process may be performed on the dielectric layer 1040 to form the openings OP6. Subsequently, a portion of the dielectric layer 1030 is removed to form the openings OP5 in the dielectric layer 1043. For example, an etching process may be performed on the dielectric layer 1030 to form the openings OP5. In some embodiments, due to a higher aspect ratio, the etching rate at the bottom of the dielectric layer 1030 may be slower than the etching rate at the top of the dielectric layer 1030. As a result, each opening OP5 is formed to have slanted sidewalls, as shown in FIG. 4L. In some embodiments, the step of removing the portion of the conductive layer 1024 to form the recesses R2 and the step of removing the portion of dielectric layer 1030 to form the openings OP5 use the same photomask. As such, the dimension of each opening OP5 may be the same as or slightly smaller than the dimension of each recess R2. In other words, a maximum width of each opening OP5 is equal to or less than a sum of a width of the conductive layer 1028 and a width of the vacancy migration blocking layer 1026.

As illustrated in FIG. 4L, a plurality of conductive patterns 1050 is formed to fill up the openings OP5 of the dielectric layer 1030 and the openings OP6 of the dielectric layer 1040. In other words, the conductive patterns 1050 are embedded in the dielectric layer 1030 and the dielectric layer 1040. In some embodiments, the conductive patterns 1050 are in physical contact with the conductive patterns 1020. In some embodiments, each conductive pattern 1050 includes a seed layer 1052 and a conductive layer 1054. In other words, the seed layer 1052 and the conductive layer 1054 fill up the openings OP5 and the openings OP6 to form the conductive pattern 1050. In some embodiments, the seed layer 1052 and the conductive layer 1054 in FIG. 4L are respectively similar to the second seed layer 52 and the third conductive layer 54 in FIG. 1N, so detailed descriptions thereof are omitted herein. In some embodiments, the seed layer 1052 is constituted by two sub-layers (not shown). The first sub-layer may include titanium, titanium nitride, tantalum, tantalum nitride, cobalt, manganese, other suitable materials, or a combination thereof. On the other hand, the second sub-layer may include copper, copper alloys, or other suitable choice of materials. In some embodiments, the conductive layer 1054 is made of aluminum, titanium, copper, tungsten, and/or alloys thereof.

As illustrated in FIG. 4L, the seed layer 1052 surrounds the conductive layer 1054. For example, the seed layer 1052 covers sidewalls and a bottom surface of the conductive layer 1054. In some embodiments, the conductive layer 1054 exhibits a T-shape in the cross-sectional view of FIG. 4L. In some embodiments, each conductive pattern 1050 may be divided into a via portion 1050*a* and a line portion 1050*b* disposed on the via portion 1050*a*. In some embodiments, the via portion 1050*a* corresponds to the seed layer 1052 and the conductive layer 1054 located within the opening OP5. Meanwhile, the line portion 1050*b* corresponds to the seed layer 1052 and the conductive layer 1054 located within the opening OP6. In other words, the via portions 1050*a* are embedded in the dielectric layer 1030 and the line portions 1050*b* are embedded in the dielectric layer 1040. In some embodiments, each via portion 1050*a* is connected to the corresponding line portion 1050*b*. As illustrated in FIG. 4L, the conductive patterns 1050 are in physical contact with the conductive patterns 1020. For example, the via portion 1050*a* of each conductive pattern 1050 is in physical contact with the conductive layer 1028 of the corresponding conductive pattern 1020. As mentioned above, the dimension of each opening OP5 may be the same as or slightly smaller than the dimension of each recess R2. Since the via portions 1050*a* are formed by filling up the openings OP5, a maximum width of the via portion 1050*a* is equal to or less than the sum of the width of the conductive layer 1028 and the width of the vacancy migration blocking layer 1026. As illustrated in FIG. 4L, each conductive pattern 1050 is landed on a span of the conductive layer 1028 of the corresponding conductive pattern 1020. For example, the via portion 50*a* of each conductive pattern 1050 is landed on a span of the conductive layer 1028 of the corresponding conductive pattern 1020. In some embodiments, each via portion 1050*a* is completely located within a span of the corresponding vacancy migration blocking layer 1026 and the corresponding conductive layer 1028. For example, an edge of each via portion 1050*a* does not extend beyond an outer edge of the corresponding vacancy migration blocking layer 1026 in a top view. In some embodiments, a contour of each via portion 1050*a* is completely overlapped with an outer contour of the corresponding vacancy migration blocking layer 1026 in the top view. However, the disclosure is not limited thereto. In some alternative embodiments, the contour of each via portion 1050*a* may be located within a boundary defined by the outer contour of the corresponding vacancy migration blocking layer 1026 in the top view.

As shown in FIG. 4L, each conductive pattern 1020 has the vacancy migration blocking layer 1026 sandwiched between the conductive layer 1024 and the conductive layer 1028. The vacancy migration blocking layer 1026 may sufficiently block the vacancies in the conductive layer 1024 from arriving at the interface between the conductive pattern 1020 and the conductive pattern 1050. In other words, the vacancies of the conductive layer 1024 would cluster around the vacancy migration blocking layer 1026, which does not affect the connection between the conductive pattern 1020 and the conductive pattern 1050. Although some vacancies of the conductive layer 1028 may migrate to the interface between the conductive pattern 1020 and the conductive pattern 1050, due to the small dimension of the conductive layer 1028, the amount of these vacancies can be negligible. As such, the vacancies in the conductive layer 1028 would not form voids big enough to cause connection failure between the conductive pattern 1020 and the conductive pattern 1050. In sum, the vacancy migration blocking layer 1026 in the conductive pattern 1020 is able to resolve the issue of connection failure between the conductive pattern 1020 and the conductive pattern 1050 caused by vacancy migration, so as to enhance the reliability of the subsequently formed package PKG.

Referring to FIG. 4M, a dielectric layer 1060 and a dielectric layer 1070 are formed on the dielectric layer 1040 and the conductive patterns 1050. In some embodiments, materials and formation methods of the dielectric layer 1060 and the dielectric layer 1070 are respectively similar to that of the dielectric layer 1010, so the detailed descriptions thereof are omitted herein. In some embodiments, a plurality of conductive pads 1080 are formed in the dielectric layer 1060 and the dielectric layer 1070. That is, the conductive pads 1080 are embedded in the dielectric layer 1060 and the dielectric layer 1070. In some embodiments, each conductive pad 1080 has a via portion 1080*a* and a line portion 1080*b* disposed on the via portion 1080*a*. In some embodiments, the via portion 1080*a* is embedded in the dielectric layer 1060 and the line portion 1080*b* is embedded in the dielectric layer 1070. In some embodiments, the conductive pads 1080 are electrically connected to the conductive patterns 1050. For example, the via portion 1080*a* of each conductive pad 1080 is in physical contact with the conductive patterns 1050 to render electrical connection with the conductive patterns 1050. In some embodiments, the conductive pads 1080 are used to establish electrical connection with other components (not shown) subsequently formed or provided. In some alternative embodiments, the conductive pads 1080 may be test pads. In some embodiments, the conductive pads 1080 are aluminum pads, copper pads, or other suitable metal pads. In some embodiments, the conductive pads 1080 are formed by a sputtering process, a PVD process, a plating process, or the like.

Referring to FIG. 4N, a dielectric layer 1090 is formed on the dielectric layer 1070 and the conductive pads 1080. In some embodiments, a material and a formation method of the dielectric layer 1090 are respectively similar to that of the dielectric layer 1010, so the detailed descriptions thereof are omitted herein.

As illustrated in FIG. 4N, a plurality of under-bump metallurgy (UBM) patterns 1095 is formed on the dielectric layer 1090 and the conductive pads 1080 to complete the formation of the redistribution structure 1000. As illustrated in FIG. 4N, the UMB patterns 1095 are partially embedded in the dielectric layer 1090. In some embodiments, the UBM patterns 1095 are in physical contact with the conductive pads 1080 to render electrical connection with the conductive pads 1080. In some embodiments, the UBM patterns 1095 are formed by a sputtering process, a PVD process, a plating process, or the like. In some embodiments, the UBM patterns 1095 are made of aluminum, titanium, copper, tungsten, and/or alloys thereof.

In some embodiments, the redistribution structure 1000 includes the dielectric layer 1010, the conductive patterns 1020, the dielectric layers 1030 and 1040, the conductive patterns 1050, the dielectric layers 1060 and 1070, the conductive pads 1080, the dielectric layer 1090, and the UBM patterns 1095. As illustrated in FIG. 4N, the redistribution structure 1000 and the second die 400 are disposed on two opposite sides of the first die 100.

After the redistribution structure 1000 is formed on the first die 100 and the first encapsulant 200, a plurality of conductive terminals 1100 is disposed on the UBM patterns 1095. In some embodiments, the conductive terminals 1100 are attached to the UBM patterns 1095 through a solder flux. In some embodiments, the conductive terminals 1100 are, for example, solder balls, ball grid array (BGA) balls, or controlled collapse chip connection (C4) bumps. In some embodiments, the conductive terminals 1100 are made of a conductive material with low resistivity, such as Sn, Pb, Ag, Cu, Ni, Bi, or an alloy thereof.

Thereafter, a singulation process is performed on the redistribution structure 1000, the first encapsulant 200, the bonding layer 300, the second encapsulant 800, the bonding film BF, and the carrier C2 to obtain a plurality of packages PKG. In some embodiments, the singulation process typically involves dicing with a rotation blade and/or a laser beam. In other words, the singulation process includes a laser cutting process, a mechanical cutting process, a laser grooving process, other suitable processes, or a combination thereof.

As illustrated in FIG. 4N, the vacancy migration blocking layer 1026 is only formed in the bottommost layer of the redistribution structure 1000 (i.e., the conductive patterns 1020). However, the disclosure is not limited thereto. In some alternative embodiments, other layers of the redistribution structure 1000 may include vacancy migration blocking layer. The embodiments having vacancy migration blocking layer in other conductive patterns will be described below in conjunction with FIG. 5.

Figure 5:
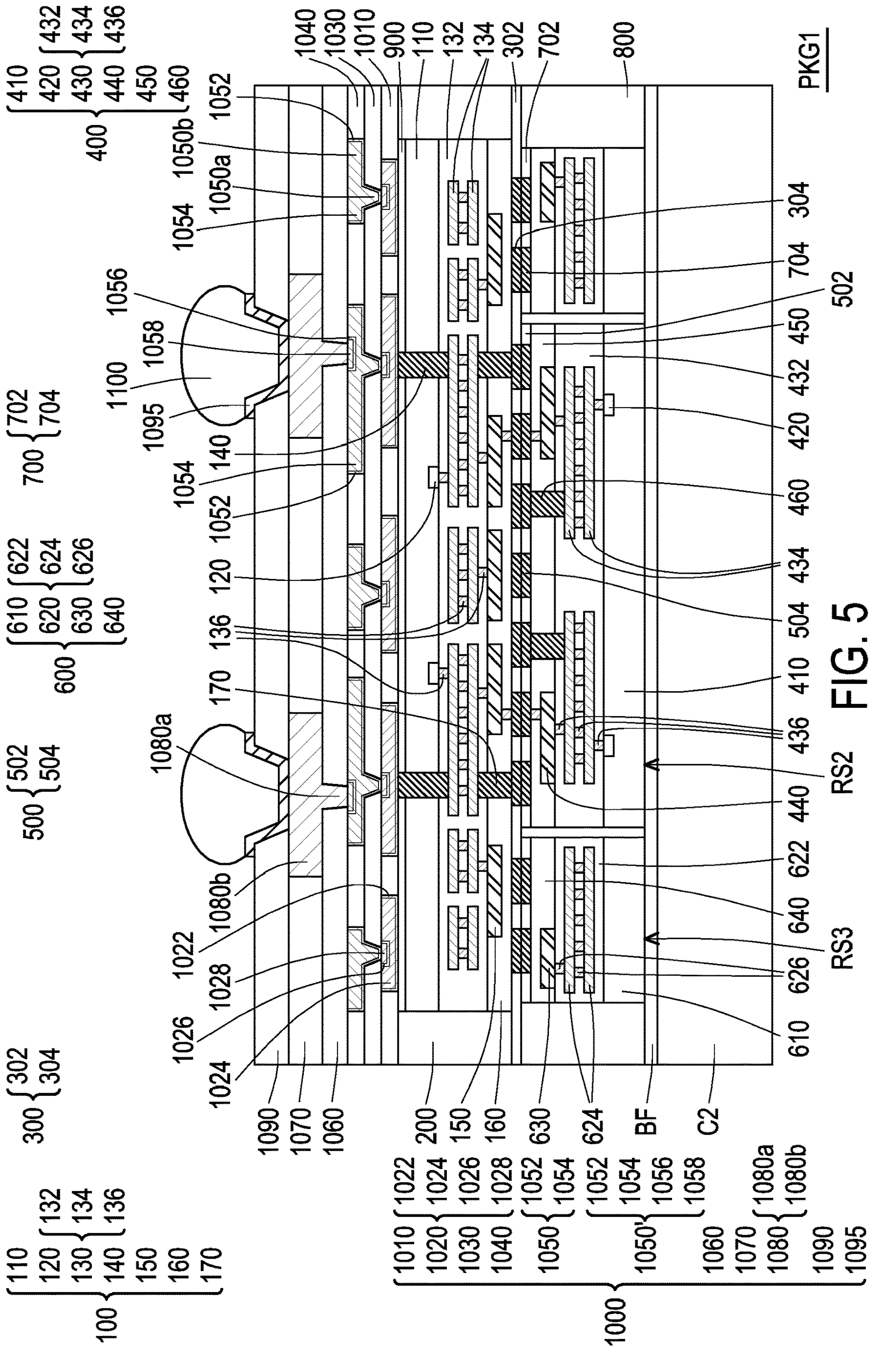
FIG. 5 is a schematic cross-sectional view illustrating a package in accordance with some alternative embodiments of the disclosure.

FIG. 5 is a schematic cross-sectional view illustrating a package PKG1 in accordance with some alternative embodiments of the disclosure. Referring to FIG. 5, the package PKG1 in FIG. 5 is similar to the package PKG in FIG. 4N, so similar elements are denoted by the same reference numerals and the detailed descriptions thereof are omitted herein. The difference between the package PKG1 in FIG. 5 and the package PKG in FIG. 4N lies in that some of the conductive patterns 1050 in the package PKG1 in FIG. 4N are replaced by conductive patterns 1050'. As illustrated in FIG. 5, each conductive pattern 1050' includes a seed layer 1052, a conductive layer 1054, a vacancy migration blocking layer 1056, and a conductive layer 1058. In some embodiments, formation methods and materials of the seed layer 1052, the conductive layer 1054, the vacancy migration blocking layer 1056, and the conductive layer 1058 are respectively similar to that of the seed layer 1022, the conductive layer 1024, the vacancy migration blocking layer 1026, and the conductive layer 1028 in FIG. 4K, so the detailed descriptions thereof are omitted herein.

In some embodiments, the vacancy migration blocking layer 1056 surrounds the conductive layer 1058. For example, the vacancy migration blocking layer 1056 exhibits a U-shape in the cross-sectional view of FIG. 5 to surround the conductive layer 1058. That is, the vacancy migration blocking layer 1056 covers sidewalls and a bottom surface of the conductive layer 1058. As illustrated in FIG. 5, the vacancy migration blocking layer 1056 and the conductive layer 1058 are embedded in the conductive layer 1054. For example, the vacancy migration blocking layer 1056 is spatially separated from the seed layer 1052. In some embodiments, the conductive layer 1054 is sandwiched between the seed layer 1052 and the vacancy migration blocking layer 1056. Meanwhile, the vacancy migration blocking layer 1056 is sandwiched between the conductive layer 1054 and the conductive layer 1058.

As illustrated in FIG. 5, some of the conductive patterns (i.e., the conductive patterns 1050') located in the second tier of the redistribution structure 1000 has the vacancy migration blocking layer 1056 while the rest of the conductive patterns (i.e., the conductive patterns 1050) located in the second tier of the redistribution structure 1000 is free of vacancy migration blocking layer. However, the disclosure is not limited thereto. In some alternative embodiments, all of the conductive patterns located in the second tier of the redistribution structure 1000 may have the vacancy migration blocking layer 1056. As illustrated in FIG. 5, the conductive patterns 1050' are located directly underneath the conductive terminals 1100. However, the disclosure is not limited thereto. In some alternative embodiments, the conductive patterns 1050' are not vertically overlapped with the conductive terminals 1100.

It should be noted that although FIG. 5 shows that the vacancy migration blocking layer (i.e., the vacancy migration blocking layers 1026 and 1056) are only located in the first tier (i.e., the bottommost layer) and the second tier of the redistribution structure 1000, the disclosure is not limited thereto. In some alternative embodiments, the vacancy migration blocking layer may also exist in the conductive patterns located at other tiers of the redistribution structure 1000.

As shown in FIG. 5, each conductive pattern 1050' has the vacancy migration blocking layer 1056 sandwiched between the conductive layer 1054 and the conductive layer 1058. The vacancy migration blocking layer 1056 may sufficiently block the vacancies in the conductive layer 1054 from arriving at the interface between the conductive pattern 1050' and the conductive pad 1080. In other words, the vacancies of the conductive layer 1054 would cluster around the vacancy migration blocking layer 1056, which does not affect the connection between the conductive pattern 1050' and the conductive pad 1080. Although some vacancies of the conductive layer 1058 may migrate to the interface between the conductive pattern 1050' and the conductive pad 1080, due to the small dimension of the conductive layer 1058, the amount of these vacancies can be negligible. As such, the vacancies in the conductive layer 1058 would not form voids big enough to cause connection failure between the conductive pattern 1050' and the conductive pad 1080. In sum, the vacancy migration blocking layer 1056 in the conductive pattern 1050' is able to resolve the issue of connection failure between the conductive pattern 1050' and the conductive pad 1080 caused by vacancy migration, so as to enhance the reliability of the package PKG1.

As mentioned above, the patterns forming method illustrated in FIG. 1A to FIG. 1N may be utilized in forming conductive features in a package. The adoption of the foregoing patterns forming method in a redistribution structure of a different package is exemplified below in conjunction with FIG. 6.

Figure 6:
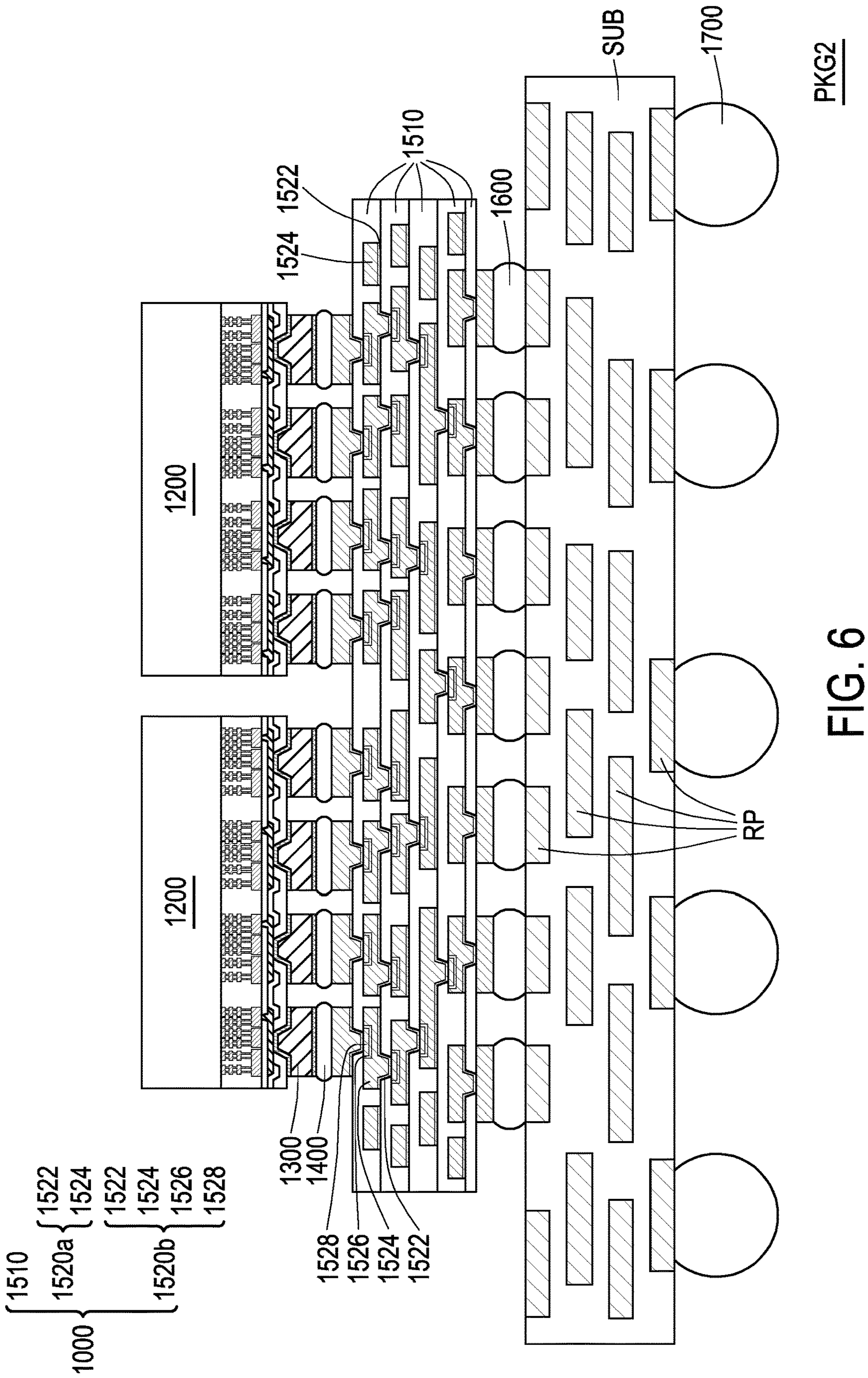
FIG. 6 is a schematic cross-sectional view illustrating a package in accordance with some alternative embodiments of the disclosure.

FIG. 6 is a schematic cross-sectional view illustrating a package PKG2 in accordance with some alternative embodiments of the disclosure. Referring to FIG. 6, the package PKG2 includes a plurality of integrated circuits 1200, an interposer 1500, a plurality of conductive terminals 1400, a substrate SUB, and a plurality of conductive terminals 1700. As illustrated in FIG. 6, each integrated circuit 1200 includes a semiconductor substrate, an interconnection structure, conductive pads, a passivation layer, and a post-passivation layer. The interconnection structure is disposed on the semiconductor substrate. The conductive pads, the passivation layer, and the post-passivation layer are sequentially disposed over the interconnection structure. In some embodiments, the integrated circuit 1200 is capable of performing logic functions. For example, the integrated circuit 1200 may be a CPU die, a GPU die, a FPGA, or the like.

In some embodiments, the interposer 1500 may be referred to a redistribution layer (RDL) interposer. In some embodiments, the interposer 1500 includes a plurality of dielectric layers 1510, a plurality of conductive patterns 1520*a*, and a plurality of conductive patterns 1520*b*. In some embodiments, a material of the dielectric layers 1510 includes polyimide, epoxy resin, acrylic resin, phenolic resin, BCB, PBO, or any other suitable polymer-based dielectric material. In some embodiments, the dielectric layers 1510 include resin mixed with filler. The dielectric layers 1510 may be formed by suitable fabrication techniques, such as film lamination, spin-on coating, CVD, PECVD, or the like.

In some embodiments, each conductive pattern 1520*a* includes a seed layer 1522 and a conductive layer 1524. In some embodiments, formation methods and materials of the seed layer 1522 and the conductive layer 1524 are respectively similar to that of the seed layer 1052 and the conductive layer 1054 in FIG. 4L, so the detailed descriptions thereof are omitted herein. In some embodiments, the conductive layer 1524 is disposed on the seed layer 1522.

In some embodiments, each conductive pattern 1520*b* includes a seed layer 1522, a conductive layer 1524, a vacancy migration blocking layer 1526, and a conductive layer 1528. In some embodiments, formation methods and materials of the seed layer 1522, the conductive layer 1524, the vacancy migration blocking layer 1526, and the conductive layer 1528 are respectively similar to that of the seed layer 1022, the conductive layer 1024, the vacancy migration blocking layer 1026, and the conductive layer 1028 in FIG. 4K, so the detailed descriptions thereof are omitted herein. In some embodiments, the vacancy migration blocking layer 1526 surrounds the conductive layer 1528. For example, the vacancy migration blocking layer 1526 exhibits a U-shape in the cross-sectional view of FIG. 6 to surround the conductive layer 1528. That is, the vacancy migration blocking layer 1526 covers sidewalls and a bottom surface of the conductive layer 1528. As illustrated in FIG. 6, the vacancy migration blocking layer 1526 and the conductive layer 1528 are embedded in the conductive layer 1524. For example, the vacancy migration blocking layer 1526 is spatially separated from the seed layer 1522. In some embodiments, the conductive layer 1524 is sandwiched between the seed layer 1522 and the vacancy migration blocking layer 1526. Meanwhile, the vacancy migration blocking layer 1526 is sandwiched between the conductive layer 1524 and the conductive layer 1528.

The vacancy migration blocking layer 1526 may sufficiently block the vacancies in the conductive layer 1524 from arriving at the interface between the conductive pattern 1520*b* and the vertically adjacent conductive pattern 1520*a* or the vertically adjacent conductive pattern 1520*b*. In other words, the vacancies of the conductive layer 1524 would cluster around the vacancy migration blocking layer 1526, which does not affect the connection between the conductive pattern 1520*b* and the vertically adjacent conductive pattern 1520*a* or the vertically adjacent conductive pattern 1520*b*. Although some vacancies of the conductive layer 1528 may migrate to the interface between the conductive pattern 1520*b* and the vertically adjacent conductive pattern 1520*a* or the vertically adjacent conductive pattern 1520*b*, due to the small dimension of the conductive layer 1528, the amount of these vacancies can be negligible. As such, the vacancies in the conductive layer 1528 would not form voids big enough to cause connection failure between the conductive pattern 1520*b* and the vertically adjacent conductive pattern 1520*a* or the vertically adjacent conductive pattern 1520*b*. In sum, the vacancy migration blocking layer 1526 in the conductive pattern 1520*b* is able to resolve the issue of connection failure between the conductive pattern 1520*b* and the vertically adjacent conductive pattern 1520*a* or the vertically adjacent conductive pattern 1520*b* caused by vacancy migration, so as to enhance the reliability of the package PKG2.

As illustrated in FIG. 6, the integrated circuits 1200 are bonded to the interposer 1500. In some embodiments, the integrated circuits 1200 are attached to the interposer 1500 through conductive posts 1300 and conductive terminals 1400. In some embodiments, the conductive posts 1300 are in physical contact with the conductive pads of the integrated circuits 1200 and the conductive terminals 1400. On the other hand, the conductive terminals 1400 are in physical contact with the conductive posts 1300 and the topmost conductive patterns 1520*a*. That is, the integrated circuits 1200 are electrically connected to the interposer 1500. In some embodiments, the integrated circuits 1200 are attached to the interposer 1500 through flip-chip bonding.

In some embodiments, the substrate SUB includes a plurality of routing patterns RP embedded therein. In some embodiments, the routing patterns RP are interconnected with one another. That is, the routing patterns RP are electrically connected to one another. In some embodiments, the substrate SUB is a printed circuit board (PCB) or the like. In some embodiments, the substrate SUB is referred to as a circuit substrate.

As illustrated in FIG. 6, the interposer 1500 is bonded to the substrate SUB through the conductive terminals 1600. In some embodiments, the conductive terminals 1600 are solder balls, ball grid array (BGA) balls, or the like. In some embodiments, the conductive terminals 1600 are made of a conductive material with low resistivity, such as Sn, Pb, Ag, Cu, Ni, Bi, or an alloy thereof. In some embodiments, the conductive terminals 1600 electrically connect the interposer 1500 and the substrate SUB.

In some embodiments, the conductive terminals 1700 are formed on the substrate SUB opposite to the interposer 1500. In some embodiments, the conductive terminals 1700 are solder balls, BGA balls, or the like. In some embodiments, the conductive terminals 1700 are made of a conductive material with low resistivity, such as Sn, Pb, Ag, Cu, Ni, Bi, or an alloy thereof. In some embodiments, the conductive terminals 1700 are in physical contact with the routing patterns RP of the substrate SUB. In some embodiments, the package PKG2 may be referred to as a chip-on-wafer-on substrate (CoWoS) package.

In accordance with some embodiments of the disclosure, a method of forming patterns includes at least the following steps. A first dielectric layer having a first opening is provided. A first seed layer and a first conductive layer are deposited in the first opening. A portion of the first conductive layer is removed to form a recess. A vacancy migration blocking layer and a second conductive layer are deposited in the recess such that the first seed layer, the first conductive layer, the vacancy migration blocking layer, and the second conductive layer form a first pattern.

In accordance with some embodiments of the disclosure, a package includes a first die, a first encapsulant, and a redistribution structure. The first encapsulant laterally encapsulates the first die. The redistribution structure is disposed on the first die and the first encapsulant. The redistribution structure includes a first dielectric layer and a first conductive pattern embedded in the first dielectric layer. The first conductive pattern includes a seed layer, a first conductive layer, a vacancy migration blocking layer, and a second conductive layer. The vacancy migration blocking layer is sandwiched between the first conductive layer and the second conductive layer.

In accordance with some embodiments of the disclosure, a manufacturing method of a package includes at least the following steps. A die is provided. The die is encapsulated by an encapsulant. A redistribution structure is formed on the die and the encapsulant. The redistribution structure is formed by at least the following steps. A first dielectric layer is formed on the die. The first dielectric layer has a first opening. The first opening is filled by a first seed layer and a first conductive layer. A portion of the first conductive layer is removed to form a recess. The recess is filled by a vacancy migration blocking layer and a second conductive layer such that the first seed layer, the first conductive layer, the vacancy migration blocking layer, and the second conductive layer form a first conductive pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming patterns, comprising:

providing a first dielectric layer having a first opening;

depositing a first seed layer and a first conductive layer in the first opening;

removing a portion of the first conductive layer to form a recess within the first conductive layer; and depositing a vacancy migration blocking layer and a second conductive layer in the recess such that the first seed layer, the first conductive layer, the vacancy migration blocking layer, and the second conductive layer form a first pattern.

2. The method of claim 1, further comprising:

depositing a second dielectric layer and a third dielectric layer on the first dielectric layer and the first pattern;

removing a portion of the third dielectric layer to form a second opening in the third dielectric layer;

removing a portion of the second dielectric layer to form a third opening in the second dielectric layer; and depositing a second seed layer and a third conductive layer into the second opening and the third opening to form a second pattern.

3. The method of claim 2, wherein the step of removing the portion of the first conductive layer and the step of removing the portion of the second dielectric layer use a same photomask.

4. The method of claim 2, wherein the second pattern is formed to land on a span of the second conductive layer.

5. The method of claim 1, wherein a material of the first seed layer and a material of the vacancy migration blocking layer comprise titanium, titanium nitride, tantalum, tantalum nitride, cobalt, and/or manganese, and a material of the first conductive layer and a material of the second conductive layer comprise copper.

6. The method of claim 1, wherein the vacancy migration blocking layer is formed to sandwich between the first conductive layer and the second conductive layer.

7. A package, comprising:

a first die;

a first encapsulant laterally encapsulating the first die; and a redistribution structure disposed on the first die and the first encapsulant, comprising:

a first dielectric layer; and a first conductive pattern embedded in the first dielectric layer, wherein the first conductive pattern comprises a seed layer, a first conductive layer, a vacancy migration blocking layer, and a second conductive layer, the vacancy migration blocking layer is sandwiched between the first conductive layer and the second conductive layer, and the seed layer is separated from the vacancy migration blocking layer.

8. The package of claim 7, wherein the first conductive layer is sandwiched between the seed layer and the vacancy migration blocking layer.

9. The package of claim 7, wherein the vacancy migration blocking layer exhibits a U-shape in a cross-sectional view.

10. The package of claim 7, wherein a material of the seed layer and a material of the vacancy migration blocking layer are the same, and a material of the first conductive layer and a material of the second conductive layer are the same.

11. The package of claim 10, wherein the material of the seed layer and the material of the vacancy migration blocking layer comprise titanium, titanium nitride, tantalum, tantalum nitride, cobalt, and/or manganese, and the material of the first conductive layer and the material of the second conductive layer comprise copper.

12. The package of claim 7, wherein the redistribution structure further comprises:

a second dielectric layer and a third dielectric layer disposed on the first dielectric layer and the first conductive pattern; and a second conductive pattern comprising a via portion and a line portion disposed on the via portion, wherein the via portion is embedded in the second dielectric layer and is in physical contact with the first conductive pattern, and the line portion is embedded in the third dielectric layer.

13. The package of claim 12, wherein the via portion of the second conductive pattern is landed on a span of the second conductive layer of the first conductive pattern.

14. The package of claim 12, wherein a maximum width of the via portion is equal to or less than a sum of a width of the second conductive layer and a width of the vacancy migration blocking layer.

15. The package of claim 7, further comprising:

a second die disposed on the first die opposite to the redistribution structure;

a dummy die adjacent to the second die; and a second encapsulant laterally encapsulating the second die and the dummy die.

16. A manufacturing method of a package, comprising:

providing a die;

encapsulating the die by an encapsulant; and forming a redistribution structure on the die and the encapsulant, comprising:

forming a first dielectric layer on the die, wherein the first dielectric layer has a first opening;

filling the first opening by a first seed layer and a first conductive layer;

removing a portion of the first conductive layer to form a recess within the first conductive layer; and filling the recess by a vacancy migration blocking layer and a second conductive layer such that the first seed layer, the first conductive layer, the vacancy migration blocking layer, and the second conductive layer form a first conductive pattern.

17. The method of claim 16, wherein the step of forming the redistribution structure further comprises:

forming a second dielectric layer and a third dielectric layer on the first dielectric layer and the first conductive pattern;

removing a portion of the third dielectric layer to form a second opening in the third dielectric layer;

removing a portion of the second dielectric layer to form a third opening in the second dielectric layer; and filling the second opening and the third opening by a second seed layer and a third conductive layer to form a second conductive pattern.

18. The method of claim 17, wherein the step of removing the portion of the first conductive layer and the step of removing the portion of the second dielectric layer use a same photomask.

19. The method of claim 17, wherein the second conductive pattern is formed to land on a span of the second conductive layer.

20. The method of claim 16, wherein the vacancy migration blocking layer is formed to sandwich between the first conductive layer and the second conductive layer.

* * * * *